(12) United States Patent
Isaka

(10) Patent No.: US 11,658,642 B2
(45) Date of Patent: May 23, 2023

(54) MULTIPLEXER

(71) Applicant: TAIYO YUDEN CO., LTD., Tokyo (JP)

(72) Inventor: Fumiaki Isaka, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 224 days.

(21) Appl. No.: 16/985,169

(22) Filed: Aug. 4, 2020

(65) Prior Publication Data

US 2021/0050844 A1    Feb. 18, 2021

(30) Foreign Application Priority Data

Aug. 13, 2019    (JP) .............................. JP2019-148577

(51) Int. Cl.
| H03H 9/70 | (2006.01) |
| H03H 9/72 | (2006.01) |
| H03H 9/05 | (2006.01) |
| H03H 9/25 | (2006.01) |
| H03H 9/145 | (2006.01) |
| H03H 9/64 | (2006.01) |

(52) U.S. Cl.
CPC .............. *H03H 9/70* (2013.01); *H03H 9/058* (2013.01); *H03H 9/145* (2013.01); *H03H 9/25* (2013.01); *H03H 9/6483* (2013.01); *H03H 9/72* (2013.01)

(58) Field of Classification Search
CPC ............... H03H 9/25; H03H 9/65; H03H 9/72
See application file for complete search history.

(56) References Cited

U.S. PATENT DOCUMENTS

| 7,378,922 B2 * | 5/2008 | Kubo ................... H03H 9/1092 |
| | | 333/133 |
| 9,634,641 B2 * | 4/2017 | Nishimura ........... H03H 9/0576 |
| 10,090,825 B2 * | 10/2018 | Kuroyanagi ...... H01L 23/53214 |
| 10,396,757 B2 * | 8/2019 | Kakita .............. H01L 23/53242 |

(Continued)

FOREIGN PATENT DOCUMENTS

| JP | 2007-067617 A | 3/2007 |
| JP | 2017-157922 A | 9/2017 |

(Continued)

*Primary Examiner* — Hafizur Rahman
*Assistant Examiner* — Alan Wong
(74) *Attorney, Agent, or Firm* — Stein IP, LLC

(57) ABSTRACT

A multiplexer includes: first and second substrates overlapping with each other with an air gap interposed therebetween; a first filter disposed on the first substrate and including first series resonators connected in series with a first path, and first parallel resonators; and a second filter disposed on the second substrate and including second series resonators connected in series with a second path, and second parallel resonators connected between the second path and a ground, each of the second series resonators and the second parallel resonators including a piezoelectric film, a first electrode interposed between the piezoelectric film and the second substrate, a second electrode interposed between the piezoelectric film and the air gap, and a resonance region, in at least one second parallel resonator, the first electrode being coupled to the second path, the second electrode being coupled to the ground, the resonance region overlapping with the first path.

12 Claims, 22 Drawing Sheets

(56) References Cited

U.S. PATENT DOCUMENTS

| | | | |
|---|---|---|---|
| 10,560,068 B2 * | 2/2020 | Kuroyanagi | H03H 9/0576 |
| 10,826,460 B2 * | 11/2020 | Itou | H03H 9/605 |
| 10,903,819 B2 * | 1/2021 | Kuroyanagi | H03H 9/058 |
| 10,911,019 B2 * | 2/2021 | Isaka | H03H 9/605 |
| 2017/0250669 A1 | 8/2017 | Kuroyanagi et al. | H03H 9/059 |
| 2017/0272051 A1 | 9/2017 | Kurihara et al. | H03H 9/02984 |
| 2017/0294895 A1 | 10/2017 | Kakita et al. | H03H 9/64 |
| 2017/0331455 A1 * | 11/2017 | Kuroyanagi | H03H 9/0514 |
| 2017/0346463 A1 | 11/2017 | Hatakeyama et al. | H03H 9/64 |
| 2018/0278238 A1 | 9/2018 | Kuroyanagi | H03H 9/72 |

FOREIGN PATENT DOCUMENTS

| | | |
|---|---|---|
| JP | 2017-169139 A | 9/2017 |
| JP | 2017-188807 A | 10/2017 |
| JP | 2017-204827 A | 11/2017 |
| JP | 2017-212628 A | 11/2017 |
| JP | 2018-006626 A | 1/2018 |
| JP | 2018-157510 A | 10/2018 |

\* cited by examiner

SAMPLE A

SAMPLE B

MULTIPLEXER

CROSS-REFERENCE TO RELATED APPLICATION

This application is based upon and claims the benefit of priority of the prior Japanese Patent Application No. 2019-148577, filed on Aug. 13, 2019, the entire contents of which are incorporated herein by reference.

FIELD

A certain aspect of the present embodiments relates to a multiplexer.

BACKGROUND

It is known to mount two substrates each having a filter formed thereon such that the faces on which the filter is formed face each other across an air gap as disclosed in, for example, Japanese Patent Application Publication No. 2007-067617 (hereinafter, referred to as Patent Document 1). Patent Document 1 discloses that the two filters are arranged such that the two filters overlap in a plan view, and that two filters are arranged such that the two filters do not overlap in a plan view. It is also known to interpose a shield pattern between the two substrates as disclosed in, for example, Japanese Patent Application Publication No. 2017-204827 (hereinafter, referred to as Patent Document 2). For example, Japanese Patent Application Publication No. 2018-157510 (hereinafter, referred to as Patent Document 3) discloses that the series resonators electrically closest to the common terminal are made to overlap with each other.

SUMMARY

When two filters are arranged such that the two filters overlap, the filters interfere with each other, and thereby, the isolation characteristics deteriorate. In particular, when wiring lines through which high-frequency signals are transmitted overlap, the isolation characteristics deteriorate.

According to a first aspect of the present embodiments, there is provided a multiplexer including: a first substrate having a first surface; a second substrate having a second surface that overlaps with the first surface with an air gap interposed between the first surface and the second surface in a plan view; a first filter disposed on the first surface, the first filter including one or more first series resonators connected in series with a first series path from a common terminal to a first terminal, and one or more first parallel resonators each having a first end coupled to the first series path and a second end coupled to a ground; and a second filter disposed on the second surface, the second filter including one or more second series resonators connected in series with a second series path from the common terminal to a second terminal, and one or more second parallel resonators each having a first end coupled to the second series path and a second end coupled to a ground, each of the one or more second series resonators and the one or more second parallel resonators including a piezoelectric film, a first electrode that is interposed between the piezoelectric film and the second substrate, and a second electrode that is interposed between the piezoelectric film and the air gap and forms a resonance region where the second electrode overlaps with the first electrode with at least a part of the piezoelectric film interposed between the first electrode and the second electrode in a plan view, in at least one second series resonator of the one or more second series resonators, the first electrode being coupled to the second terminal, the second electrode being coupled to the common terminal, at least a part of the resonance region overlapping with at least a part of the first series path in a plan view.

According to a second aspect of the present embodiments, there is provided a multiplexer including: a first substrate having a first surface; a second substrate having a second surface that overlaps with the first surface with an air gap interposed between the first surface and the second surface in a plan view; a first filter disposed on the first surface, the first filter including one or more first series resonators connected in series with a first series path from a common terminal to a first terminal, and one or more first parallel resonators each having a first end coupled to the first series path and a second end coupled to a ground; and a second filter disposed on the second surface, the second filter including one or more second series resonators connected in series with a second series path from the common terminal to a second terminal, and one or more second parallel resonators each having a first end coupled to the second series path and a second end coupled to a ground, each of the one or more second series resonators and the one or more second parallel resonators including a piezoelectric film, a first electrode interposed between the piezoelectric film and the second substrate, and a second electrode that is interposed between the piezoelectric film and the air gap and forms a resonance region where the second electrode overlaps with the first electrode with at least a part of the piezoelectric film interposed between the first electrode and the second electrode in a plan view, in at least one second series resonator of the one or more second series resonators, the first electrode being coupled to the second terminal, the second electrode being coupled to the common terminal, at least a part of the resonance region overlapping with at least a part of the first series path in a plan view.

DETAILED DESCRIPTION

Hereinafter, embodiments will be described with reference to the accompanying drawings.

First Embodiment

Figure 1:
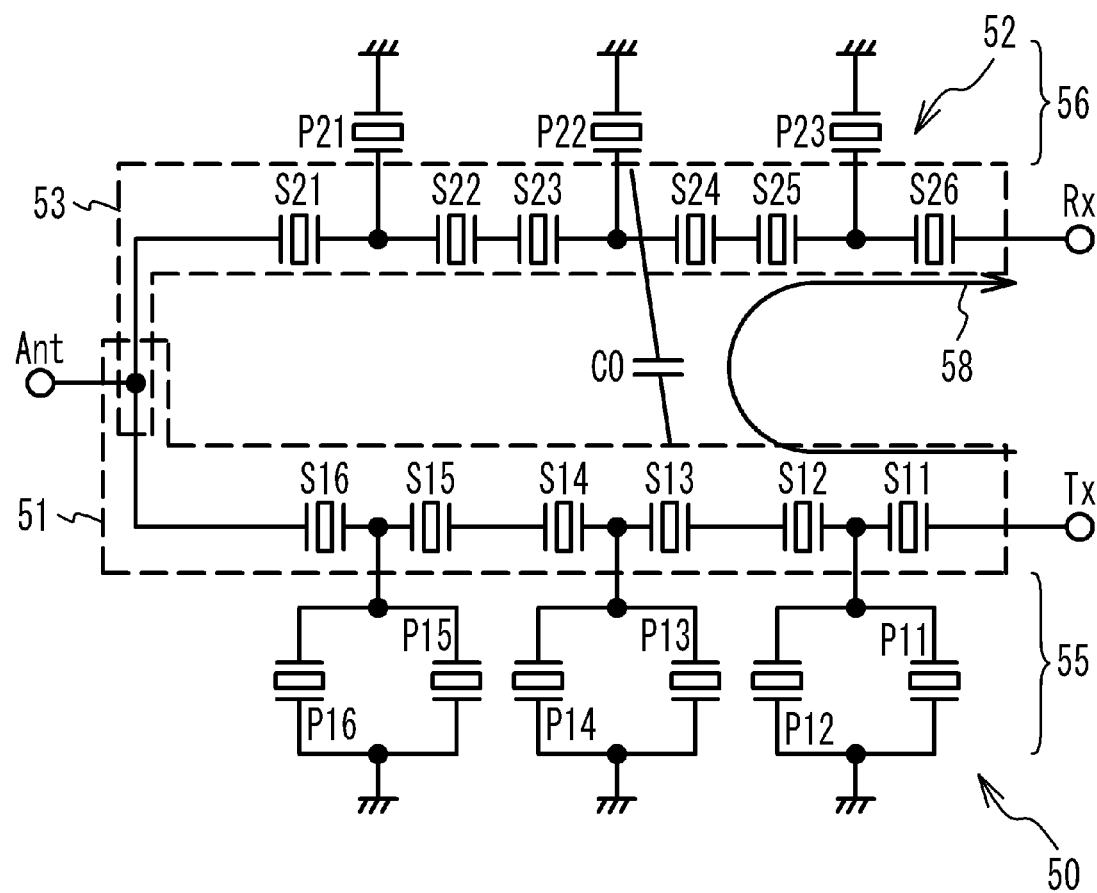
FIG. 1 is a circuit diagram of a multiplexer in accordance with a first embodiment.

FIG. 1 is a circuit diagram of a multiplexer in a first embodiment. As illustrated in FIG. 1, a transmit filter 50 (a first filter) is connected between a common terminal Ant and a transmit terminal Tx (a first terminal). A receive filter 52 (a second filter) is connected between the common terminal Ant and a receive terminal Rx (a second terminal). The passband of the transmit filter 50 does not overlap with the passband of the receive filter 52. The transmit filter 50 outputs signals in the transmit band to the common terminal Ant among high-frequency signals input to the transmit terminal Tx, and suppresses signals in other frequency bands. The receive filter 52 outputs signals in the receive band to the receive terminal Rx among high-frequency signals input to the common terminal Ant, and suppresses signals with other frequencies.

The transmit filter 50 is a ladder-type filter, and includes series resonators S11 to S16 (first series resonators) and parallel resonators P11 to P16 (first parallel resonators). The series resonators S11 to S16 are connected in series with a series path 51 (a first series path) from the common terminal Ant to the transmit terminal Tx. Each of the parallel resonators P11 to P16 is connected in series with a parallel path 55 having a first end connected to the series path 51 and a second end connected to a ground.

The receive filter 52 is a ladder-type filter, and includes series resonators S21 to S26 (second series resonators) and parallel resonators P21 to P23 (second parallel resonators). The series resonators S21 to S26 are connected in series with a series path 53 (a second series path) from the common terminal Ant to the receive terminal Rx. Each of the parallel resonators P21 to P23 is connected in series with a parallel path 56 having a first end connected to the series path 53 and a second end connected to a ground.

Figure 2:
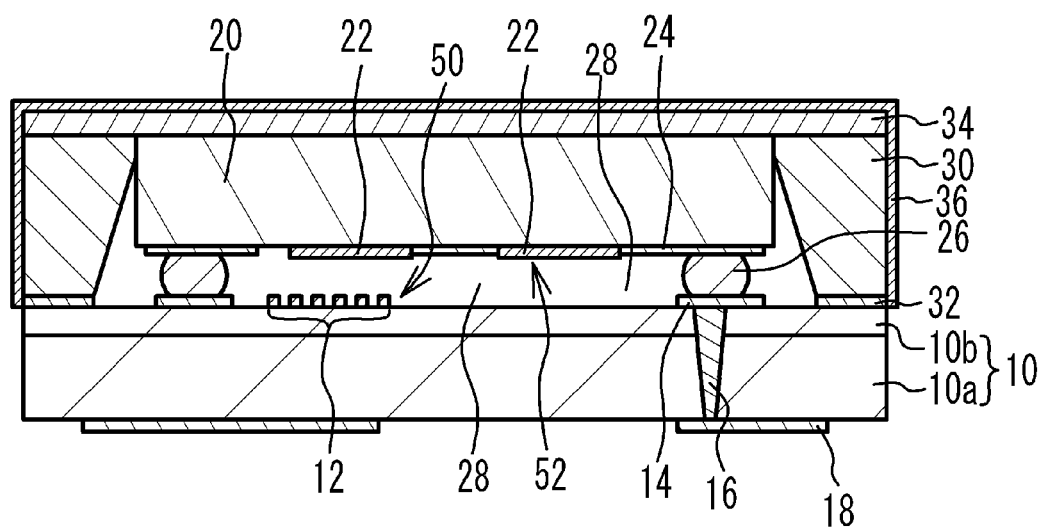
FIG. 2 is a cross-sectional view of the multiplexer in the first embodiment.

FIG. 2 is a cross-sectional view of the multiplexer in accordance with the first embodiment. As illustrated in FIG. 2, a substrate 20 is mounted on a substrate 10. The substrate 10 includes a support substrate 10a and a piezoelectric substrate 10b. The support substrate 10a is, for example, a sapphire substrate, a spinel substrate, an alumina substrate, a crystal substrate, or a silicon substrate. The piezoelectric substrate 10b is, for example, a lithium tantalate substrate or a lithium niobate substrate. The piezoelectric substrate 10b is bonded to the top surface of the support substrate 10a. The bonding face between the piezoelectric substrate 10b and the support substrate 10a is a plane surface and flat. The substrate 10 may be a piezoelectric substrate, and it is not always necessary to bond the substrate 10 to a support substrate.

The transmit filter 50 including acoustic wave resonators 12 and wiring lines 14 is disposed on the top surface (a first surface) of the substrate 10 (a first substrate). Terminals 18 are disposed on the bottom surface of the substrate 10. The terminals 18 are foot pads for connecting the acoustic wave resonators 12 and 22 to the outside. Via wirings 16 are formed so as to penetrate through the substrate 10. The via wiring 16 electrically connects the wiring line 14 and the terminal 18. The wiring line 14, the via wiring 16, and the terminal 18 are formed of a metal layer such as, but not limited to, a copper layer, an aluminum layer, or a gold layer. The terminals 18 include the common terminal Ant, the transmit terminal Tx, the receive terminal Rx, and a ground terminal.

The receive filter 52 including acoustic wave resonators 22 and wiring lines 24 is disposed on the bottom surface (a second surface) of the substrate 20 (a second substrate). The substrate 20 is, for example, a sapphire substrate, a spinel substrate, an alumina substrate, a glass substrate, a crystal substrate, or a silicon substrate. The wiring line 24 is formed of a metal layer such as, but not limited to, a copper layer, an aluminum layer, or a gold layer. The wiring line 14 of the substrate 10 is bonded to the wiring line 24 of the substrate 20 through a bump 26. The top surface of the substrate 10 and the bottom surface of the substrate 20 overlap with each other with the air gap 28 interposed therebetween in a plan view.

A ring-shaped metal layer 32 is formed in the periphery of the top surface of the substrate 10. A sealing portion 30 is located on the substrate 10 so as to surround the substrate 20. The sealing portion 30 is bonded to the ring-shaped metal layer 32. The sealing portion 30 is made of a metal such as solder or an insulating material such as resin. A lid 34 is disposed on the top surfaces of the substrate 20 and the sealing portion 30. The lid 34 is a metal plate made of kovar or the like or an insulation plate. A protective film 36 is formed so as to cover the sealing portion 30 and the lid 34. The protective film 36 is a metal film such as a nickel film or an insulating film.

Figure 3A:
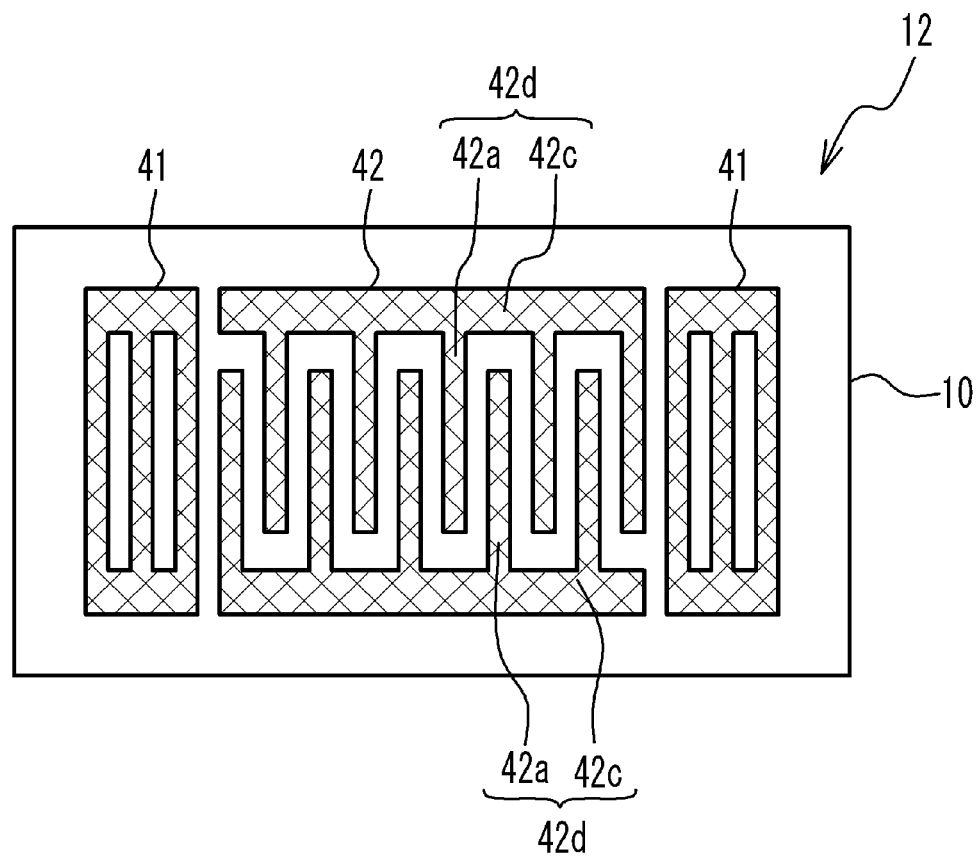
FIG. 3A is a plan view of an acoustic wave resonator 12.
Figure 3B:
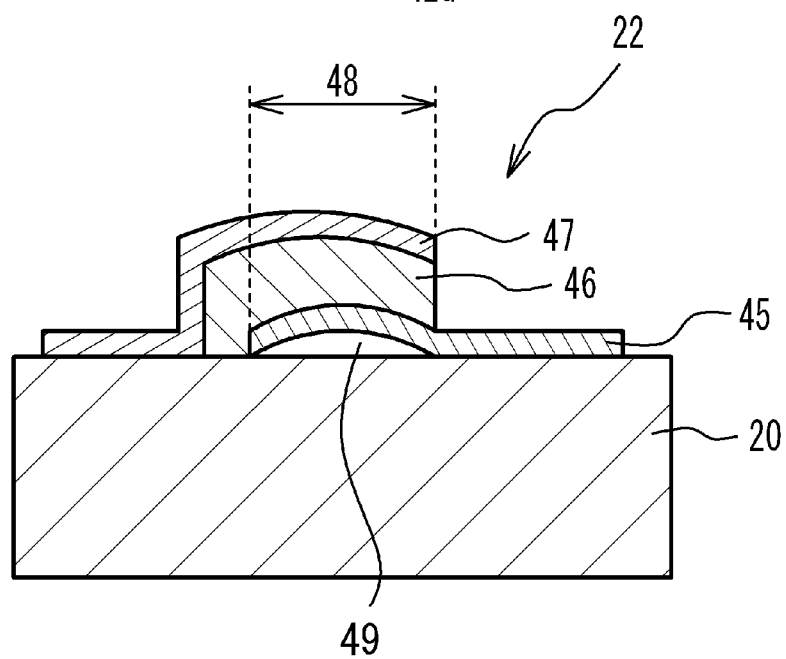
FIG. 3B is a cross-sectional view of an acoustic wave resonator 22.

FIG. 3A is a plan view of the acoustic wave resonator 12, and FIG. 3B is a cross-sectional view of the acoustic wave resonator 22. As illustrated in FIG. 3A, the acoustic wave resonator 12 is a surface acoustic wave resonator. An interdigital transducer (IDT) 42 and reflectors 41 are formed on the substrate 10 that is a piezoelectric substrate. The IDT 42 includes a pair of comb-shaped electrodes 42d facing each other. The comb-shaped electrode 42d includes a plurality of electrode fingers 42a and a bus bar 42c connecting the electrode fingers 42a. The reflectors 41 are located at both sides of the IDT 42. The IDT 42 excites a surface acoustic wave on the substrate 10. The IDT 42 and the reflectors 41 are formed of, for example, an aluminum film or a copper film. A protective film or a temperature compensation film may be formed on the substrate 10 so as to cover the IDT 42 and the reflectors 41.

As illustrated in FIG. 3B, the acoustic wave resonator 22 is a piezoelectric thin film resonator. A piezoelectric film 46 is formed on the substrate 20. A lower electrode 45 (a first electrode) and an upper electrode 47 (a second electrode) are formed so as to sandwich the piezoelectric film 46 therebetween. The lower electrode 45 is interposed between the piezoelectric film 46 and the substrate 20, and the upper electrode 47 is interposed between the piezoelectric film 46 and the air gap 28. An air gap 49 is formed between the lower electrode 45 and the substrate 20. Instead of the air gap 49, an acoustic mirror reflecting the acoustic wave may be interposed between the lower electrode 45 and the substrate 20. The region where the lower electrode 45 and the upper electrode 47 overlap with each other with at least a part of the piezoelectric film 46 interposed therebetween in a plan view is a resonance region 48. The lower electrode 45 and the upper electrode 47 in the resonance region 48 excite an acoustic wave in the thickness extension mode in the piezoelectric film 46. The lower electrode 45 and the upper electrode 47 are formed of a metal film such as a ruthenium film. The piezoelectric film 46 is, for example, an aluminum nitride film.

Each of the acoustic wave resonators 12 and 22 includes an electrode exciting the acoustic wave. Thus, so as not to inhibit the excitation of the acoustic wave, the acoustic wave resonators 12 and 22 are covered with the air gap 28 illustrated in FIG. 2.

The transmit filter 50 is disposed on the top surface of the substrate 10. The series resonators S11 to S16 and the parallel resonators P11 to P16 are the acoustic wave resonators 12. The receive filter 52 is disposed on the bottom surface of the substrate 20. The series resonators S21 to S26 and the parallel resonators P21 to P23 are the acoustic wave resonators 22. A part of the transmit filter 50 overlaps with a part of the receive filter 52 in a plan view. For example, the series resonator S13 of the transmit filter 50 overlaps with the parallel resonator P22 of the transmit filter 50. Thus, a parasitic capacitance C0 is formed between the series resonator S13 and the parallel resonator P22.

Signals in the receive band input from the transmit terminal Tx is suppressed by the transmit filter 50. When the transmit filter 50 overlaps with the receive filter 52, a signal leaks from the transmit filter 50 to the receive filter 52 through the air gap 28 (i.e., the parasitic capacitance C0).

Thus, as indicated by an arrow 58 in FIG. 1A, a signal in the receive band leaks from the transmit terminal Tx to the receive terminal Rx. Thus, the isolation characteristics deteriorate. The isolation characteristics are improved by arranging the transmit filter 50 and the receive filter 52 such that the transmit filter 50 and the receive filter 52 do not to overlap in a plan view. However, this structure increases the size of the multiplexer. The multiplexer is reduced in size by arranging the transmit filter 50 and the receive filter 52 such that the transmit filter 50 and the receive filter 52 overlap in a plan view. However, this structure deteriorates the isolation characteristics. Thus, in the present embodiment, the transmit filter 50 and the receive filter 52 are arranged such that a part of the transmit filter 50 overlaps with a part of the receive filter 52 in a plan view. This structure reduces the deterioration in isolation characteristics and reduces the size of the multiplexer.

Experiment

An experiment assuming a case where a part of the transmit filter 50 overlaps with a part of the receive filter 52 in a plan view was conducted.

Figure 4A:
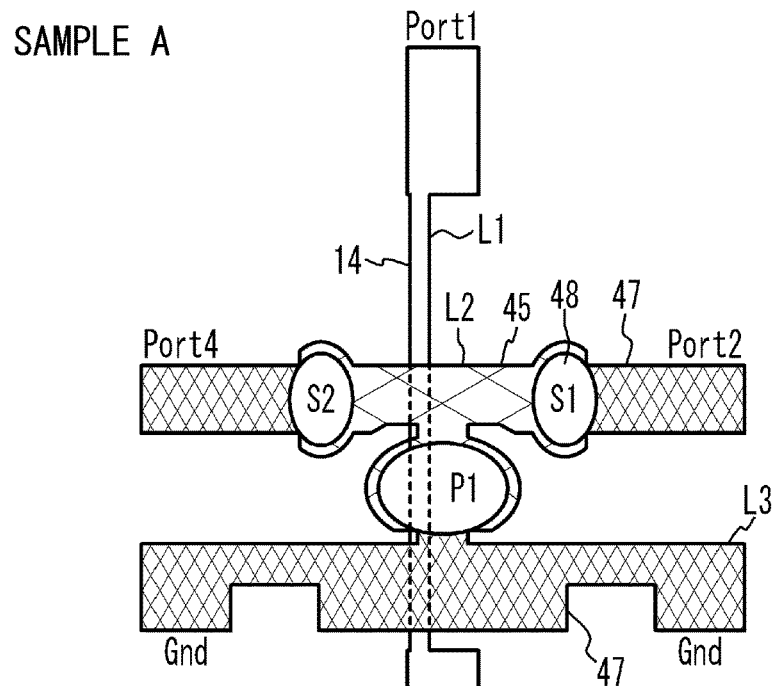
FIG. 4A and FIG. 4B are plan views of samples A and B in an experiment, respectively.
Figure 4B:
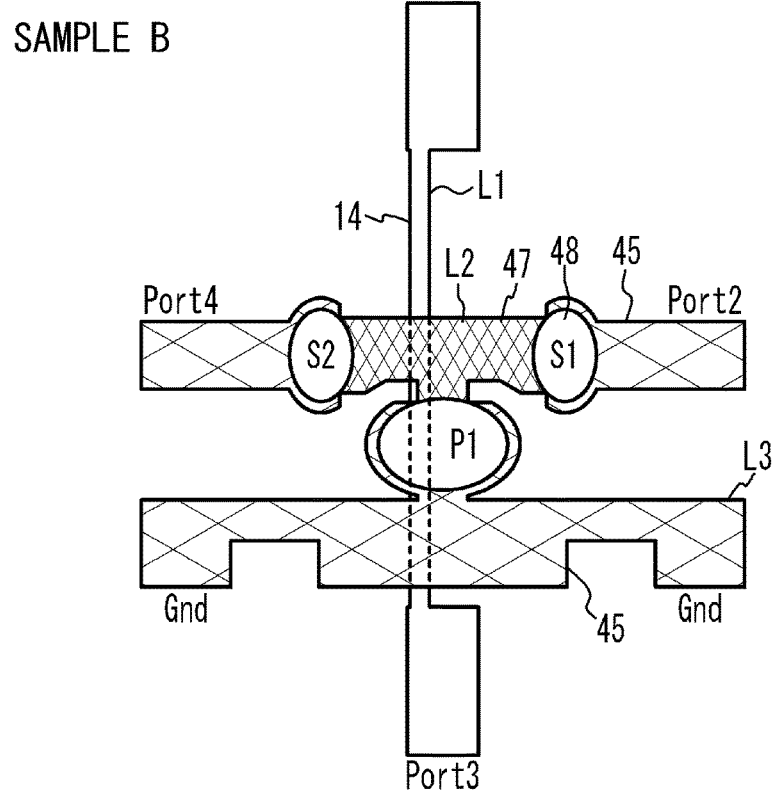
Figure 5A:
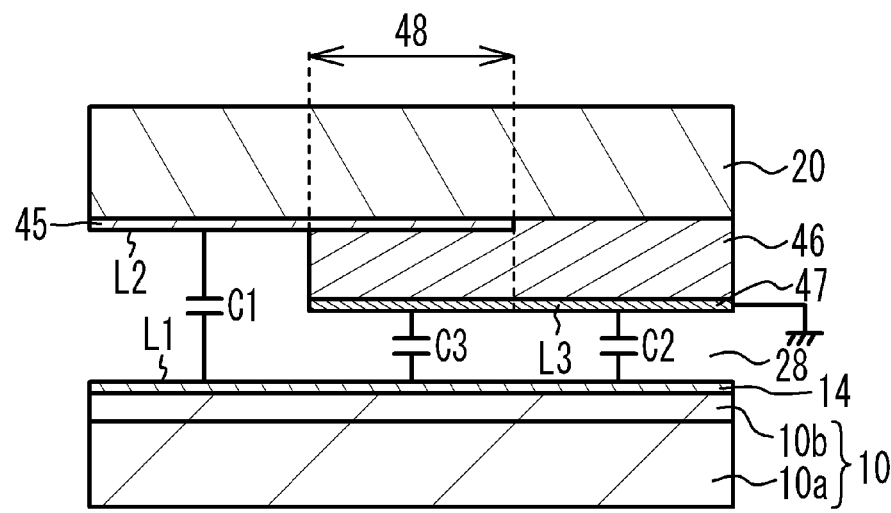
FIG. 5A and FIG. 5B are cross-sectional views of the samples A and B in the experiment, respectively.
Figure 5B:
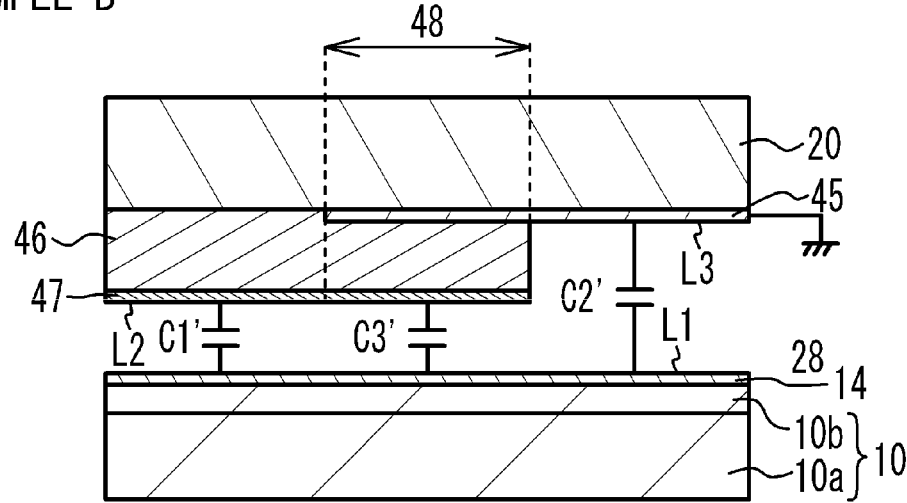

FIG. 4A and FIG. 4B are plan views of samples A and B in the experiment, respectively. FIG. 5A and FIG. 5B are cross-sectional views of the samples A and B in the experiment, respectively. FIG. 5A and FIG. 5B are cross-sectional views taken along a line L1 in FIG. 4A and FIG. 4B, respectively. The sample A corresponds to the first embodiment, and the sample B corresponds to a first comparative example.

As illustrated in FIG. 4A and FIG. 5A, in the sample A, the line L1 is connected between a port 1 (Port1) and a port 3 (Port3). The line L1 is formed of the wiring line 14 on the substrate 10. Series resonators S1 and S2 are connected in series between a port 2 (Port2) and a port 4 (Port4). A wiring line L2 connecting between the series resonators S1 and S2 is formed of the lower electrode 45. A first end of the parallel resonator P1 is connected to the wiring line L2, and a second end of the parallel resonator P1 is connected to a ground. A wiring line L3 between the parallel resonator P1 and a ground is formed of the upper electrode 47. The wiring line between the port 2 and the series resonator S1 and the wiring line between the port 4 and the series resonator S2 are formed of the upper electrode 47. The upper electrode 47 of the parallel resonator P1 is connected to a ground Gnd, and the lower electrode 45 is connected to the wiring line L2.

As illustrated in FIG. 4B and FIG. 5B, in the sample B, the wiring line L2 is formed of the upper electrode 47. The wiring line L3 connecting between the parallel resonator P1 and the ground is formed of the lower electrode 45. The wiring line between the port 2 and the series resonator S1 and the wiring line between the port 4 and the series resonator S2 are formed of the lower electrode 45. The upper electrode 47 of the parallel resonator P1 is connected to the wiring line L2, and the lower electrode 45 of the parallel resonator P1 is connected to the ground Gnd. Other structures are the same as those of the sample A, and the description thereof is thus omitted.

The dimensions and the materials of the samples A and B are as follows.

Figure 6A:
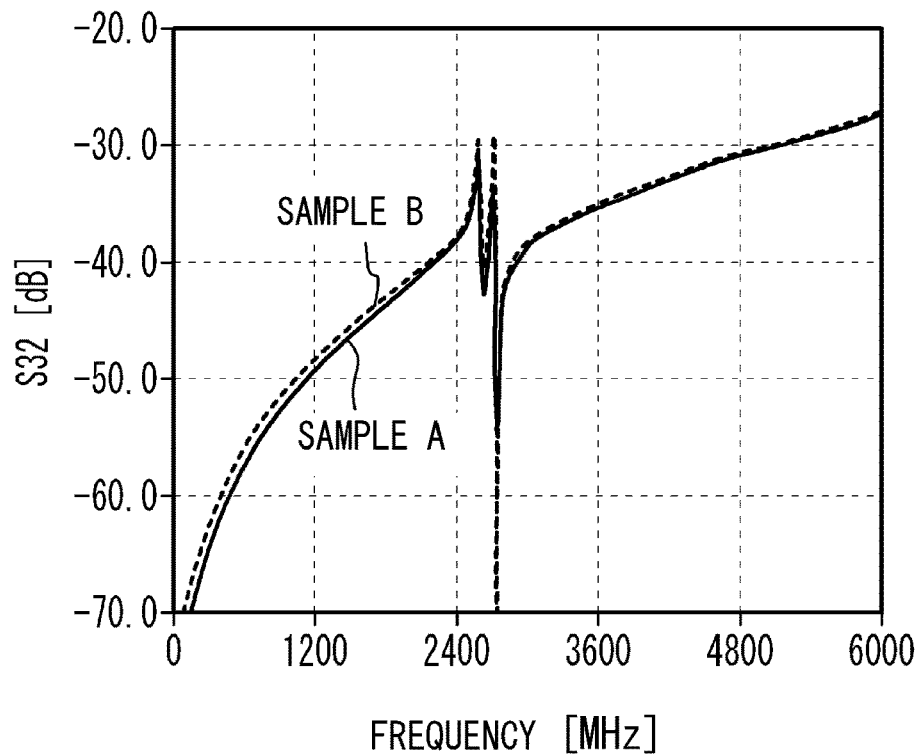
FIG. 6A is a graph of S32 versus frequency in the samples A and B of the experiment.
Figure 6B:
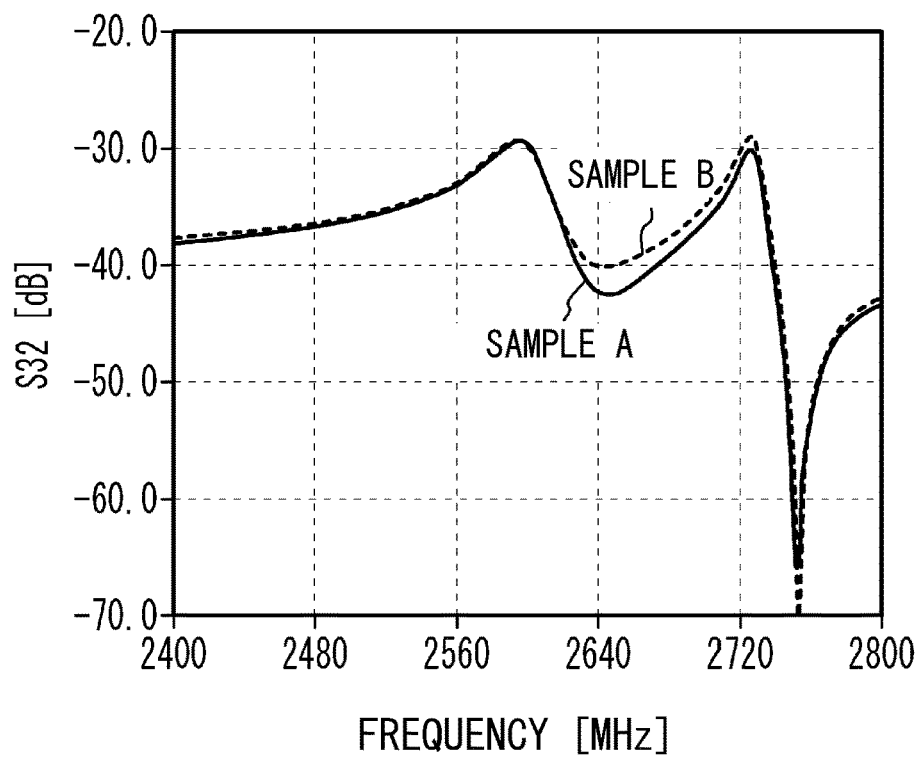
FIG. 6B is an enlarged view around a resonant frequency of FIG. 6A.

Support substrate 10a: Sapphire substrate with a thickness of 400 μm Piezoelectric substrate 10b: Lithium tantalate substrate with a thickness of 20 μm Wiring line 14: Titanium layer with a thickness of 0.03 aluminum layer with a thickness of 0.1 titanium layer with a thickness of 0.2 and gold layer with a thickness of 1 μm stacked in this order from the substrate 10 side Width of the line L1: 25 μm Size of the substrate 10: 1930 µm×1630 µm Substrate 20: Silicon substrate with a thickness of 150 µm Lower electrode 45: Chrome layer with a thickness of 0.07 µm and ruthenium layer with a thickness of 0.19 µm stacked in this order from the substrate 20 side Piezoelectric film 46: Aluminum nitride layer with a thickness of 0.94 µm Upper electrode 47: Ruthenium layer with a thickness of 0.12 µm and chrome layer with a thickness of 0.05 µm stacked in this order from the piezoelectric film 46 side Size of the substrate 20: 910 µm×710 µm Distance between the substrates 10 and 20: 10 µm Area of the region where the line L1 and the wiring line L2 overlap: 2720 µm$^2$ Area of the region where the line L1 and the wiring line L3 overlap: 3350 µm$^2$ Resonant frequencies of the series resonators S1 and S2: 2766 MHz Resonant frequency of the parallel resonator P1: 2568 MHz FIG. 6A is a graph of S32 versus frequency in the samples A and B in the experiment, and FIG. 6B is an enlarged view around the resonant frequency of FIG. 6A. S32 corresponds to the isolation characteristic from the port 3 to the port 2.

As illustrated in FIG. 6A and FIG. 6B, S32 of the sample A is smaller than S32 of the sample B. At 2640 MHz, S32 of the sample A is −42.353 dB, and S32 of the sample B is −40.004 dB. As described above, S32 of the sample A is smaller than S32 of the sample B by 2.3 dB at a maximum.

Figure 7A:
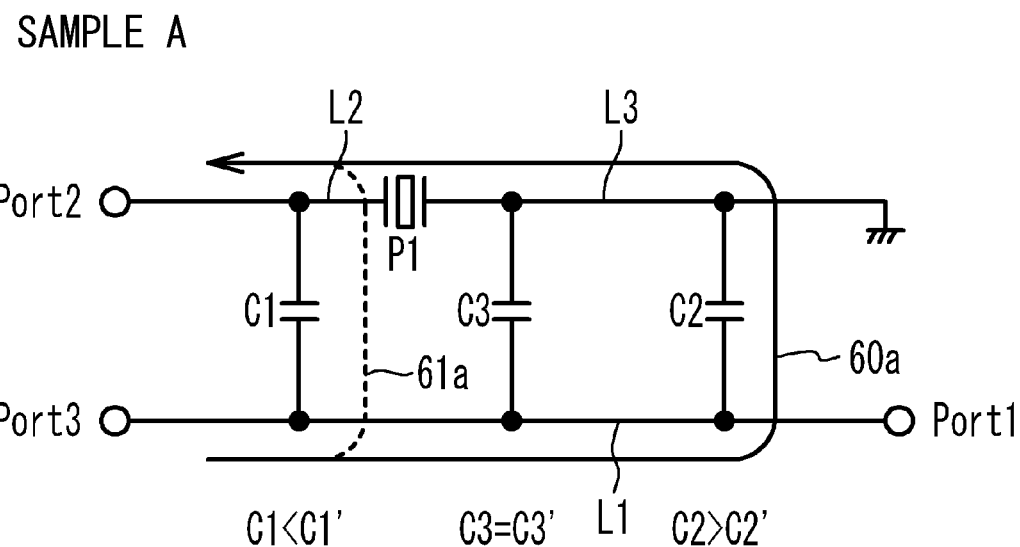
FIG. 7A and FIG. 7B illustrate equivalent circuits of the samples A and B, respectively.
Figure 7B:
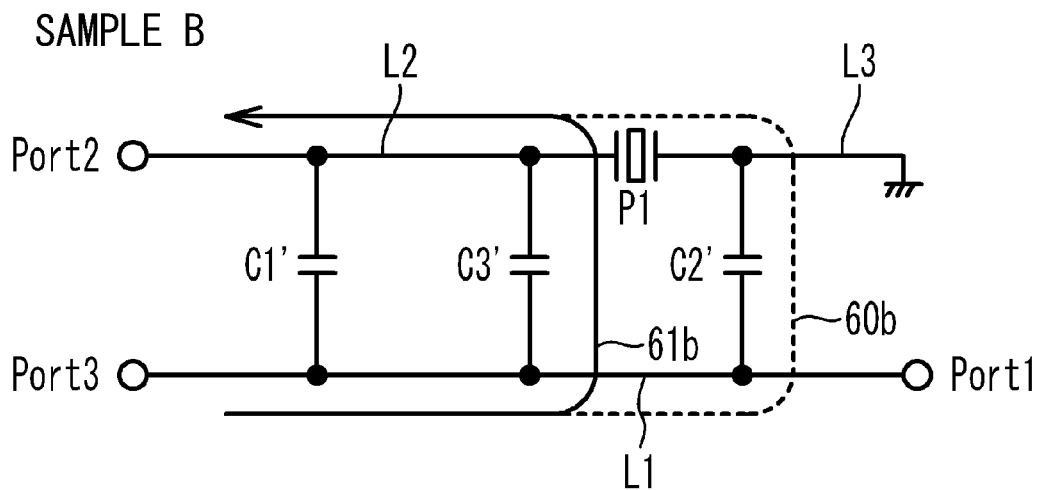

FIG. 7A and FIG. 7B illustrate equivalent circuits of the samples A and B, respectively. As illustrated in FIG. 7A, the line between the ports 1 and 3 is the line L1. The wiring line electrically closer to the port 2 of the parallel resonator P1 is the wiring line L2, and a wiring line electrically closer to the ground of the parallel resonator P1 is the wiring line L3. The capacitance C1 corresponds to the parasitic capacitance between the line L1 and the wiring line L2 in FIG. 5A, the capacitance C2 corresponds to the parasitic capacitance between the line L1 and the wiring line L3 in FIG. 5A, and the capacitance C3 corresponds to the parasitic capacitance between the line L1 and the resonance region 48 in FIG. 5A. The parasitic capacitance between the line L1 and the resonance region 48 is mainly composed of the parasitic capacitance between the upper electrode 47 in the resonance region 48 and the line L1. In the sample A, since the upper electrode 47 in the resonance region 48 is connected to the ground, the capacitance C3 is located closer to the ground than the parallel resonator P1 in terms of electrical connection.

A capacitance C1' in FIG. 7B corresponds to the parasitic capacitance between the line L1 and the wiring line L2 in FIG. 5B, a capacitance C2' in FIG. 7B corresponds to the parasitic capacitance between the line L1 and the wiring line L3 in FIG. 5B, and a capacitance C3' in FIG. 7B corresponds to the parasitic capacitance between the line L1 and the resonance region 48 in FIG. 5B. In the sample B, since the upper electrode 47 is electrically connected to the port 2, the capacitance C3' is located closer to the port 2 than the parallel resonator P1 in terms of electrical connection.

Furthermore, the distance between the line L1 and the wiring line L2 of the sample A is larger than that of the sample B as illustrated in FIG. 5A and FIG. 5B. Thus, C1<C1'. The distance between the line L1 and the wiring line L3 of the sample A is less than that of the sample B as illustrated in FIG. 5A and FIG. 5B. Thus, C2>C2'. The distance between the line L1 and the upper electrode 47 in the resonance region 48 is the same between the samples A and B as illustrated in FIG. 5A and FIG. 5B. Thus, C3=C3'.

Since C2+C3>C2', in a part electrically closer to the ground than the parallel resonator P1, a signal 60a leaking from the line L1 to the wiring line L3 and the resonance region 48 through the capacitance C2+C3 in the sample A becomes larger than a signal 60b leaking from the line L1 to the wiring line L3 through the capacitance C2' in the sample B.

Since C1<C1'+C3', in a part electrically closer to the port 2 than the parallel resonator P1, a signal 61a leaking from the line L1 to the wiring line L2 through the capacitance C1 in the sample A becomes smaller than a signal 61b leaking from the line L1 to the wiring line L2 and the upper electrode 47 in the resonance region 48 through the capacitance C1'+C3' in the sample B.

In the sample A, the signal leaking from the port 3 to the port 2 is mainly composed of the signal 60a, and the signal 60a passes through the parallel resonator P1. On the other hand, in the sample B, the signal leaking from the port 3 to the port 2 is mainly composed of the signal 61b, and the signal 61b does not pass through the parallel resonator P1. In the sample A, the signal 60a is suppressed in the parallel resonator P1. This is considered the reason why the isolation characteristic of the sample A is improved compared with that of the sample B.

Simulation

Multiplexers A and B were simulated. The simulation conditions are the same as those of the experiment described above. The multiplexer A corresponds to the first embodiment, and the multiplexer B corresponds to the first comparative example. The multiplexers A and B are multiplexers for band7 (transmit band: 2500 MH to 2570 MHz, receive band: 2620 MHz to 2690 MHz). The resonant frequency and the antiresonant frequency of each resonator were adjusted such that the functions as the multiplexer for band7 were achieved.

Multiplexer A

Figure 8A:
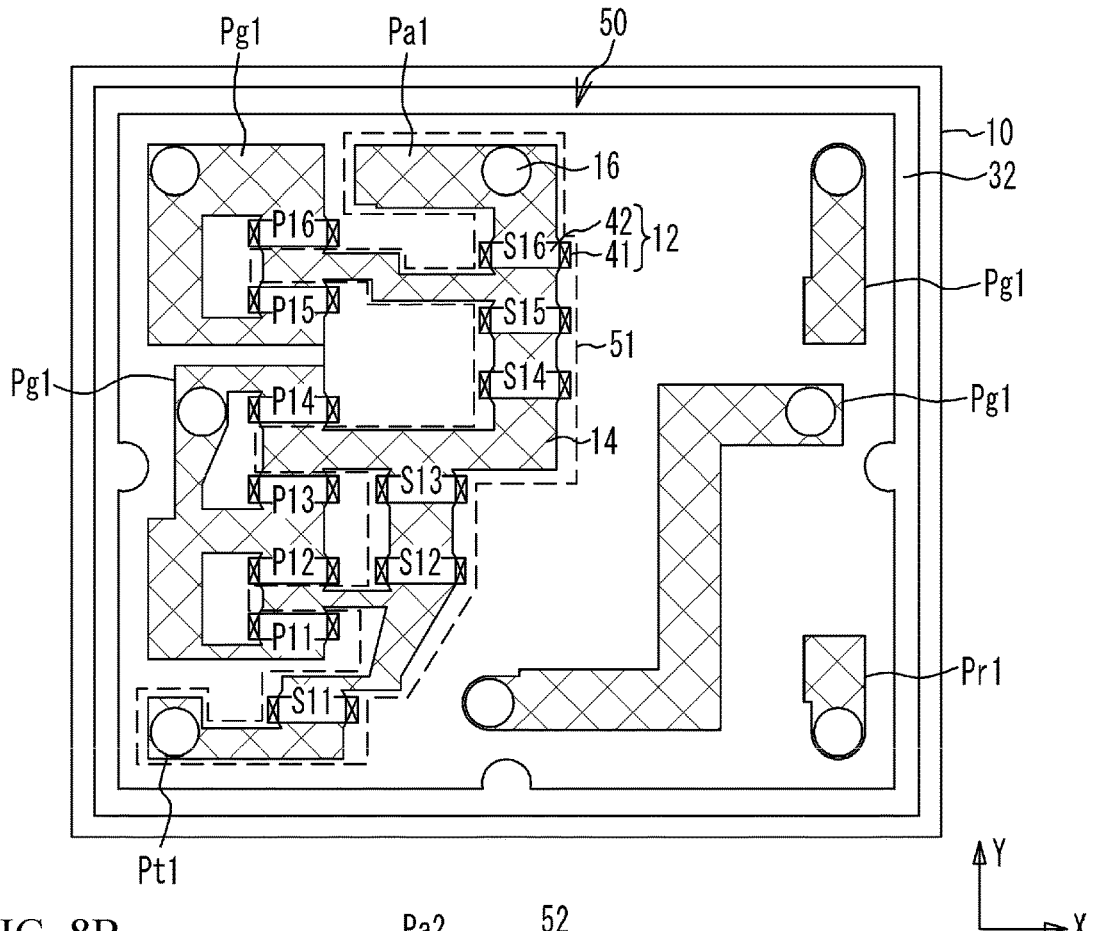
FIG. 8A is a plan view of the top surface of a substrate 10 in the multiplexer A.
Figure 8B:
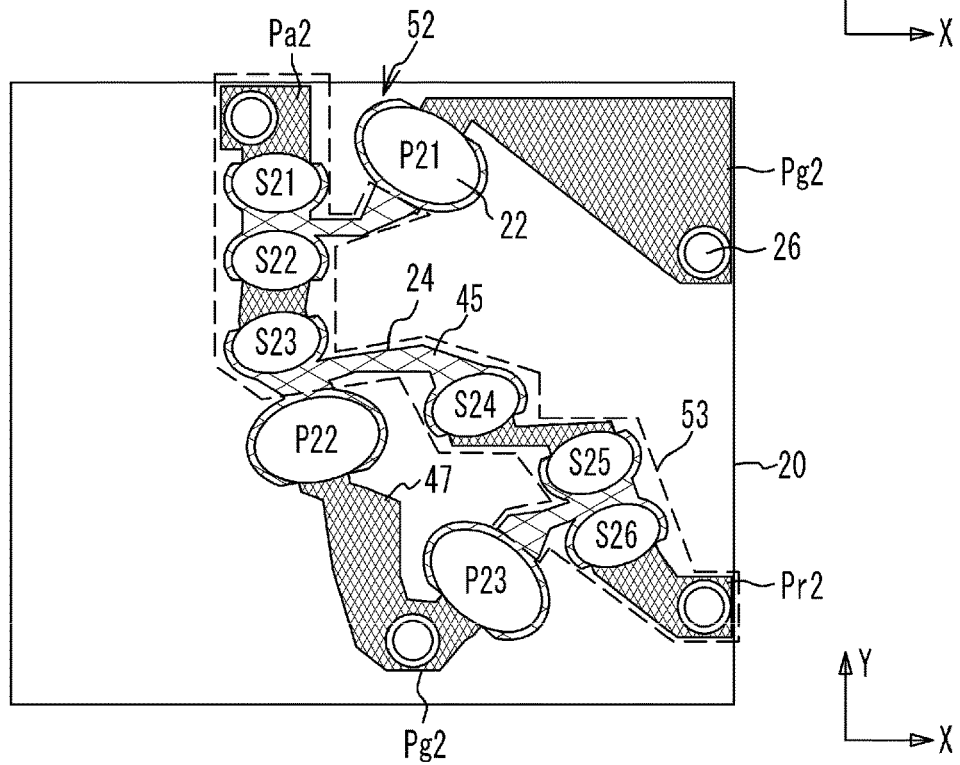
FIG. 8B is a plan view of the bottom surface of a substrate 20.

FIG. 8A is a plan view illustrating the top surface of the substrate 10 in the multiplexer A, and FIG. 8B is a plan view illustrating the bottom surface of the substrate 20. FIG. 8B is a plan view illustrating the bottom surface of the substrate 20 as viewed from above.

As illustrated in FIG. 8A, the acoustic wave resonators 12 and the wiring lines 14 are disposed on the top surface of the substrate 10. The direction parallel to the plane is defined as the X direction and the Y direction. The acoustic wave resonator 12 is a surface acoustic wave resonator. The ring-shaped metal layer 32 is formed in the periphery of the substrate 10. The via wirings 16 are connected to the wiring lines 14.

Pads Pa1, Pt1, Pr1, and Pg1 are respectively connected to the common terminal Ant, the transmit terminal Tx, the receive terminal Rx, and the ground terminal through the via wirings 16. The pad Pa1 is disposed in a peripheral part on the positive Y-side of the substrate 10, and the pad Pt1 is disposed in the corner part on the negative X side and the negative Y side of the substrate 10. The series resonators S11 to S16 are connected in series between the pads Pa1 and Pt1 through the wiring lines 14, and the parallel resonators P11 to P16 are connected in parallel between the pads Pa1 and Pt1 through the wiring lines 14. The series resonators S11 to S16 and the parallel resonators P11 to P16 form the transmit filter 50. The series resonators S11 to S16 and the wiring lines 14 connecting them form the series path 51. Paths from the series path 51 to the pads Pg1 through the parallel resonators P11 to P16 are the parallel paths 55 (see FIG. 1).

As illustrated in FIG. 8B, the acoustic wave resonators 22 and the wiring lines 24 are disposed on the bottom surface of the substrate 20. The acoustic wave resonator 22 is a piezoelectric thin film resonator. Some of the wiring lines 24 are formed of the lower electrode 45, and some of the wiring lines 24 are formed of the upper electrode 47. The wiring line 24 formed of the lower electrode 45 and the wiring line 24 formed of the upper electrode 47 are indicated by different cross-hatchings. The bumps 26 are connected to the wiring lines 24.

Pads Pa2, Pr2, and Pg2 are respectively connected to the common terminal Ant, the receive terminal Rx, and the ground terminal through the bumps 26, the wiring lines 14, and the via wirings 16. The pad Pa2 is disposed in the peripheral part on the positive Y side of the substrate 20, and the pad Pr2 is disposed in the corner part on the positive X side and the negative Y side of the substrate 10. The series resonators S21 to S26 are connected in series between the pads Pa2 and Pr2 through the wiring lines 24, and the parallel resonators P21 to P23 are connected in parallel between the pads Pa2 and Pr2 through the wiring lines 24. The series resonators S21 to S26 and the parallel resonators P21 to P23 form the receive filter 52. The series resonators S21 to S26 and the wiring lines 24 having an electric potential approximately equal to those of the series resonators S21 to S26 form the series path 53 indicated by a bold dotted line. Paths from the series path 53 to the pads Pg2 through the parallel resonators P21 to P23 are the parallel paths 56 (see FIG. 1).

Figure 9A:
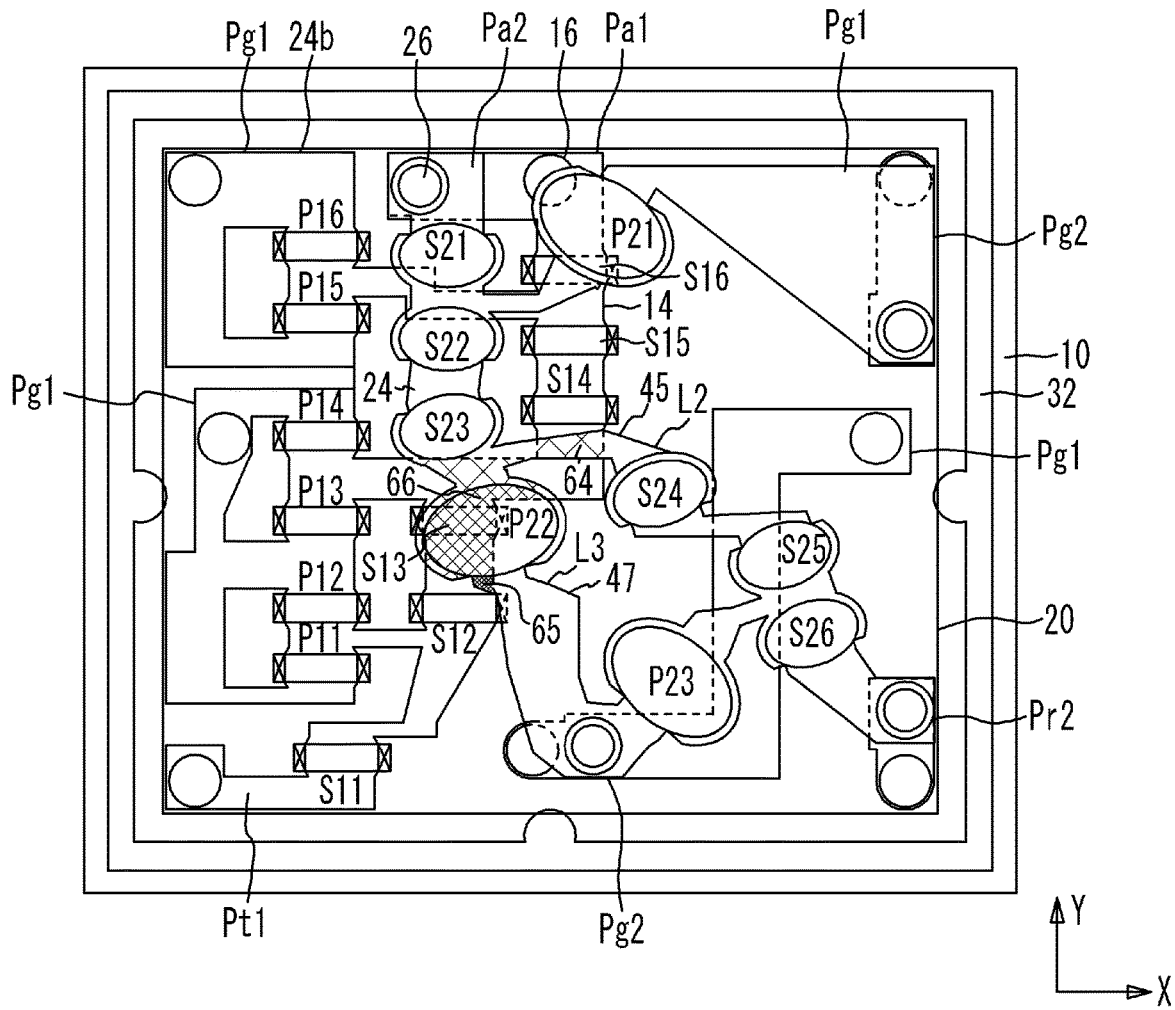
FIG. 9A is a plan view that superimposes a receive filter 52 in the multiplexer A on the top surface of the substrate 10.
Figure 9B:
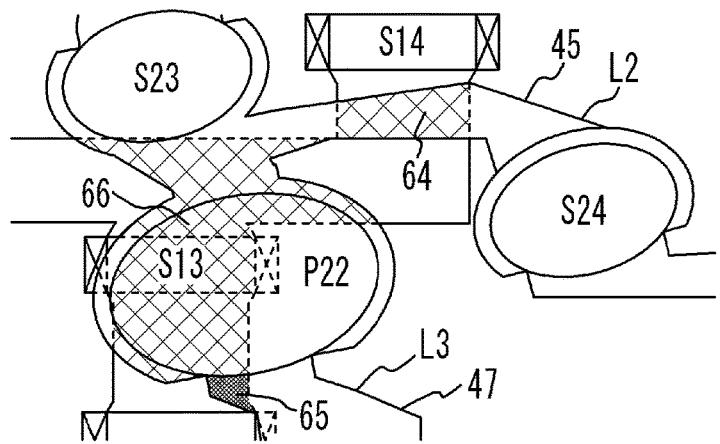
FIG. 9B is an enlarged view around a parallel resonator P22 in FIG. 9A.

FIG. 9A is a plan view that superimposes the receive filter 52 of the multiplexer A on the top surface of the substrate 10, and FIG. 9B is an enlarged view around the parallel resonator P22 in FIG. 9A. The acoustic wave resonators 22 and the wiring lines 24 of the substrate 20 are superimposed on the substrate 10. As illustrated in FIG. 9A and FIG. 9B, a part of the parallel resonator P22 overlaps with a part of the series resonator S13. The wiring line connecting between the series resonator S23 and the parallel resonator P22 and the wiring line connecting between the series resonator S24 and the parallel resonator P22 correspond to the wiring lines L2, and the wiring line connecting between the parallel resonator P22 and the ground pad Pg2 corresponds to the wiring line L3. The region where the wiring line L2 overlaps with the series path 51 is indicated as a region 64 by cross-hatching, the region where the wiring line L3 overlaps with the series path 51 is indicated as a region 65 by cross-hatching, and the region where the parallel resonator P22 overlaps with the series path 51 is indicated as a region 66 by cross-hatching. The wiring line L2 is formed of the lower electrode 45, and the wiring line L3 is formed of the upper electrode 47. Thus, in the region 64, the lower electrode 45 overlaps with the wiring line 14, and in the region 65, the upper electrode 47 overlaps with the wiring line 14. The upper electrode 47 of the parallel resonator P22 is connected to the wiring line L3.

Multiplexer B

Figure 10A:
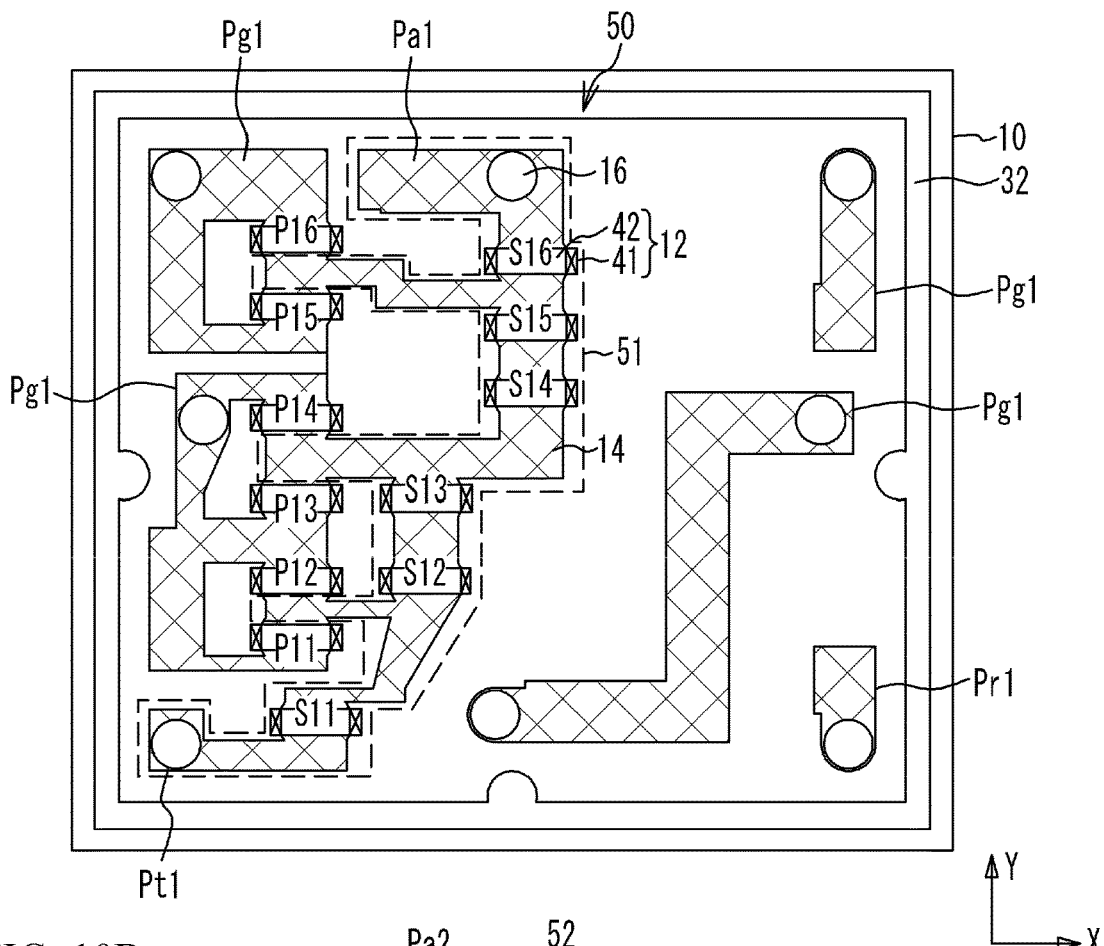
FIG. 10A is a plan view illustrating the top surface of the substrate 10 in a multiplexer B.
Figure 10B:
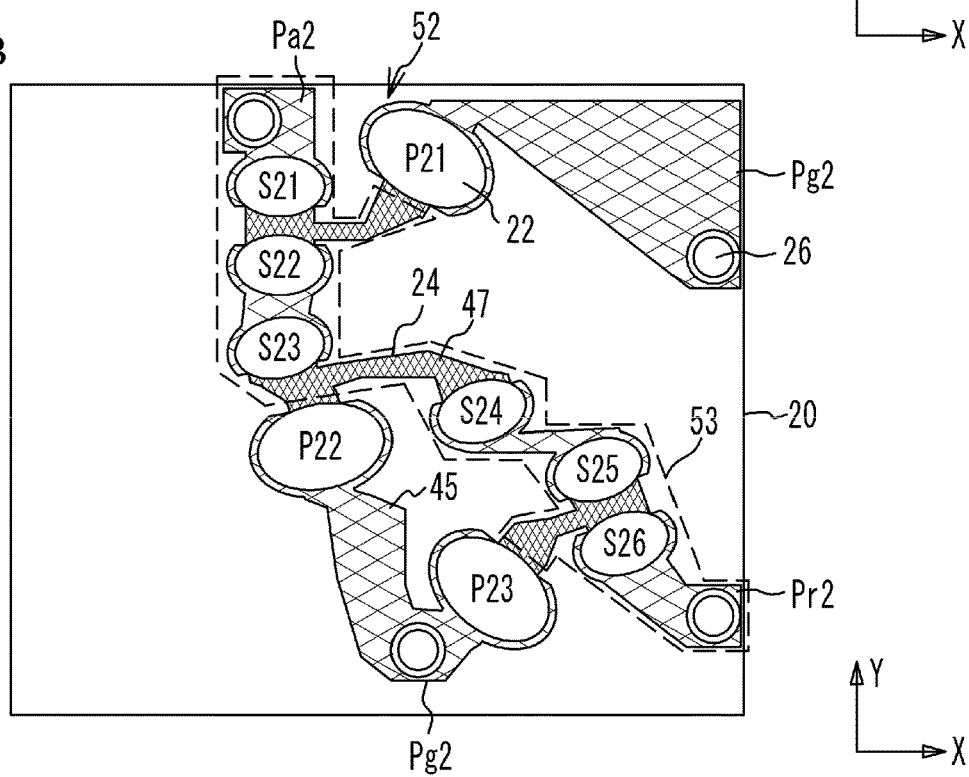
FIG. 10B is a plan view illustrating the bottom surface of the substrate 20.
Figure 11A:
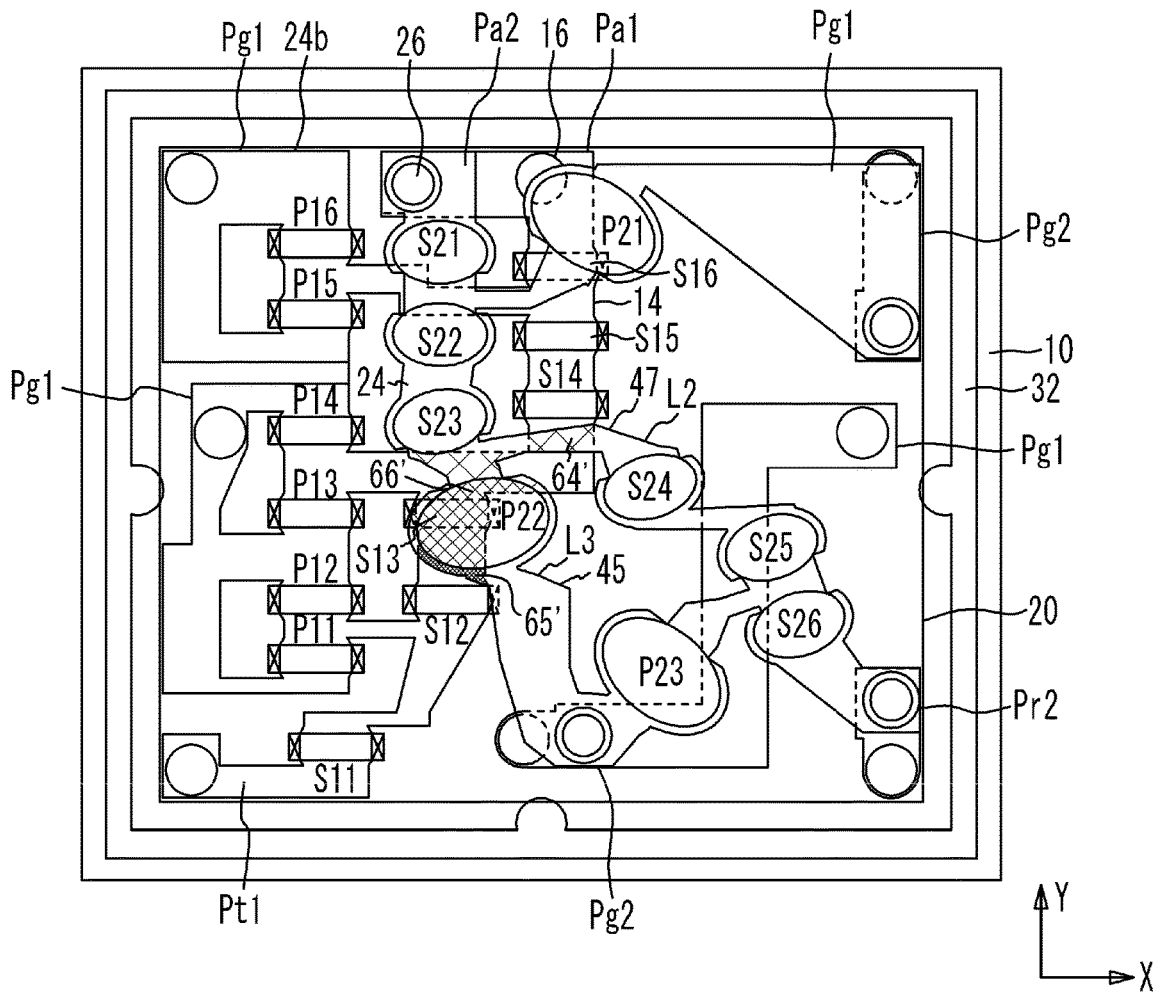
FIG. 11A is a plan view that superimposes the receive filter 52 in the multiplexer B on the top surface of the substrate 10.
Figure 11B:
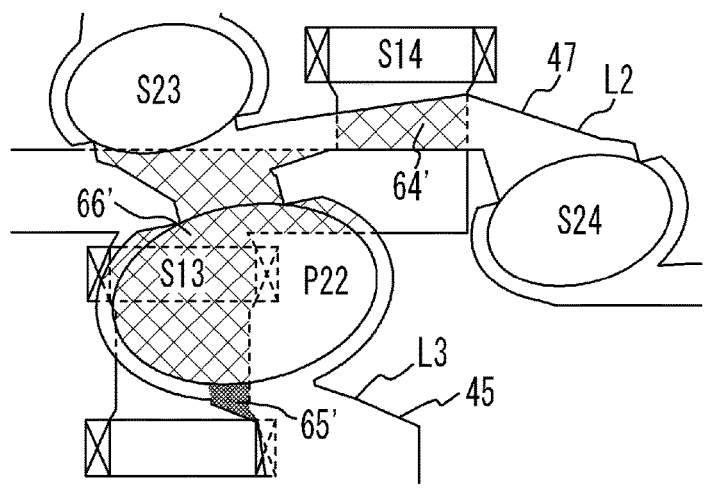
FIG. 11B is an enlarged view around the parallel resonator P22 in the FIG. 11A.

FIG. 10A is a plan view illustrating the top surface of the substrate 10 of the multiplexer B, and FIG. 10B is a plan view illustrating the bottom surface of the substrate 20. FIG. 10B is a plan view illustrating the bottom surface of the substrate 20 as viewed from above. FIG. 11A is a plan view that superimposes the receive filter 52 of the multiplexer B on the top surface of the substrate 10, and FIG. 11B is an enlarged view around the parallel resonator P22 in FIG. 11A.

As illustrated in FIG. 10A to FIG. 11B, in the multiplexer B, the positions of the lower electrodes 45 and 47 of the wiring lines 24 are interchanged from those of the multiplexer A. The region where the wiring line L2 overlaps with the series path 51 is indicated as a region 64' by cross-hatching, the region where the wiring line L3 overlaps with the series path 51 is indicated as a region 65' by cross-hatching, and the region where the resonance region of the parallel resonator P22 overlaps with the series path 51 is indicated as a region 66' by cross-hatching. The wiring line L2 is formed of the upper electrode 47, and the wiring line L3 is formed of the lower electrode 45. Thus, in the region 64', the upper electrode 47 overlaps with the wiring line 14, and in the region 65', the lower electrode 45 overlaps with the wiring line 14. The upper electrode 47 of the parallel resonator P22 is connected to the wiring line L2. Other structures are the same as those of the multiplexer A.

Figure 12A:
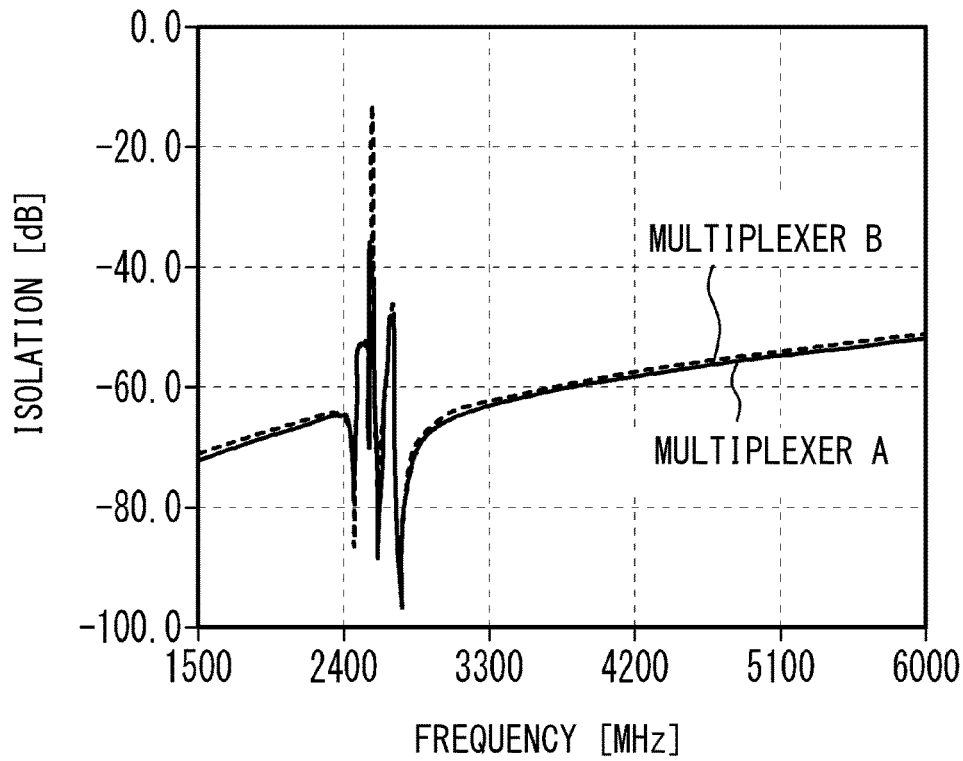
FIG. 12A is a graph of isolation versus frequency in the multiplexers A and B in a simulation.
Figure 12B:
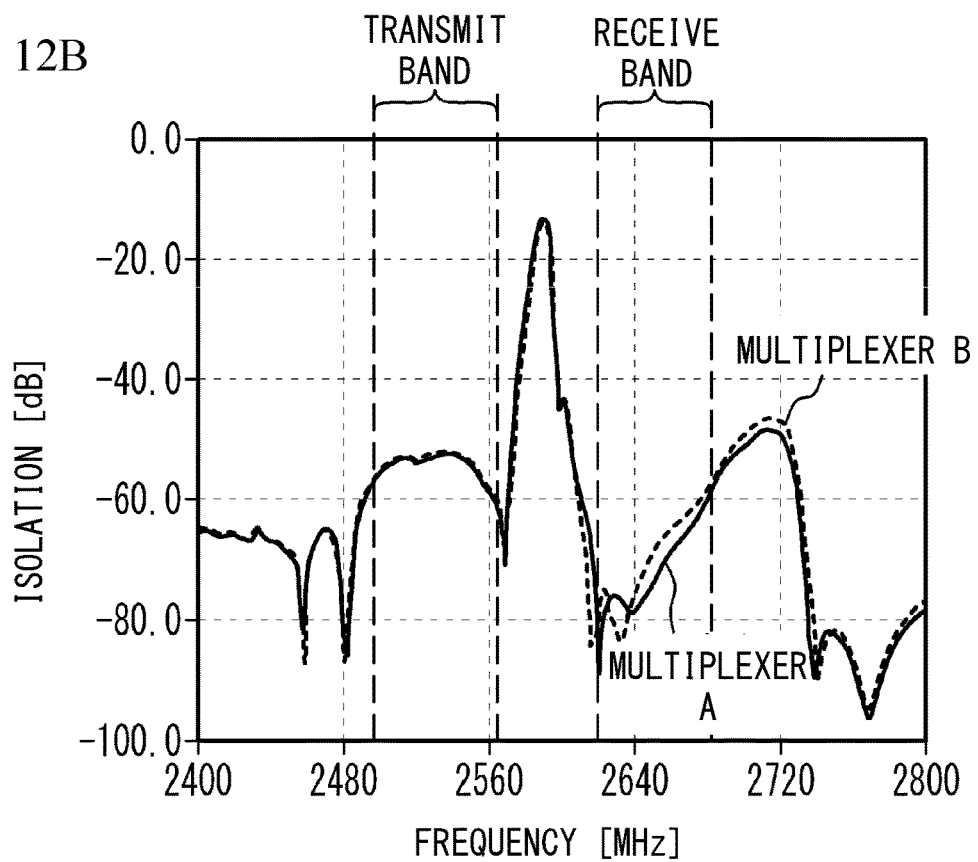
FIG. 12B is an enlarged view around a passband of FIG. 12A.

FIG. 12A is a graph of isolation versus frequency in the multiplexers A and B in the simulation, and FIG. 12B is an enlarged view around the passband of FIG. 12A. The isolation indicates leak of a high-frequency signal from the transmit terminal Tx to the receive terminal Rx.

As illustrated in FIG. 12A and FIG. 12B, the isolation is improved in the multiplexer A compared with that in the multiplexer B. In particular, as illustrated in FIG. 12B, the isolation of the multiplexer A in the receive band is improved compared with that of the multiplexer B.

When the piezoelectric thin film resonator is used as the parallel resonator P22 as in the multiplexers A and B, the electrode connected to a ground may be the upper electrode 47 or the lower electrode 45. According to the experiment and the simulation, the deterioration in isolation is reduced by using the upper electrode 47 as the electrode connected to a ground.

In the first embodiment, in at least one parallel resonator P22 of one or more parallel resonators P21 to P23, the lower electrode 45 is connected to the series path 53, the upper electrode 47 is connected to a ground, and at least a part of the resonance region 48 overlaps with at least a part of the series path 51 in a plan view. This structure allows the parallel resonator P22 to suppress signals leaking from the series path 51 to the series path 53 through the parallel resonator P22, reducing the deterioration in isolation.

In addition, in the parallel resonator P22, at least a part of the lower electrode 45 extracted from the resonance region 48 and at least a part of the upper electrode 47 extracted from the resonance region 48 overlap with at least a part of the series path 51 in a plan view. This structure allows the parallel resonator P22 to suppress signals leaking from the series path 51 to the series path 53 through the parallel resonator P22 and the wiring lines L2 and L3, reducing the deterioration in isolation.

In the parallel resonator P22, at least a part of the resonance region 48 overlaps with at least a part of at least one series resonator S13 of the series resonators S11 to S16. This structure further improves the isolation.

Signals leaking from the transmit filter 50 to the receive filter 52 through the parallel resonator P21, which is electrically closest to the common terminal Ant among the parallel resonators P21 to P23, are suppressed by the parallel resonators P22 and P23 and the series resonators S22 to S26 that are electrically closer to the receive terminal Rx than the parallel resonator P21. Thus, even when the upper electrode 47 of the parallel resonator P21 is connected to a ground and a signal is suppressed by the parallel resonator P21, the effect is not so large. Therefore, it is preferable that the parallel resonator overlapping with the series path 51 is a parallel resonator other than the parallel resonator P21 closest to the common terminal Ant in terms of electrical connection among the parallel resonators P21 to P23.

The series resonators S21 to S26 and the parallel resonators P21 to P23 preferably include a resonator that does not overlap with the series path 51 in a plan view. This structure further reduces the deterioration in isolation.

In the structure in which the parallel resonator P23 and the series resonators S24 to S26 that are electrically closer to the receive terminal Rx than the parallel resonator P22, which is closest to the receive terminal Rx in terms of electrical connection among the parallel resonators overlapping with the series path 51, overlap with the series path 51, the signal leaking from the transmit terminal Tx to the receive terminal Rx becomes large. Thus, it is preferable that the parallel resonator P23 and the series resonators S24 to S26 do not overlap with the series path 51 in a plan view. This structure further reduces the deterioration in isolation.

First Variation of the First Embodiment

Figure 13A:
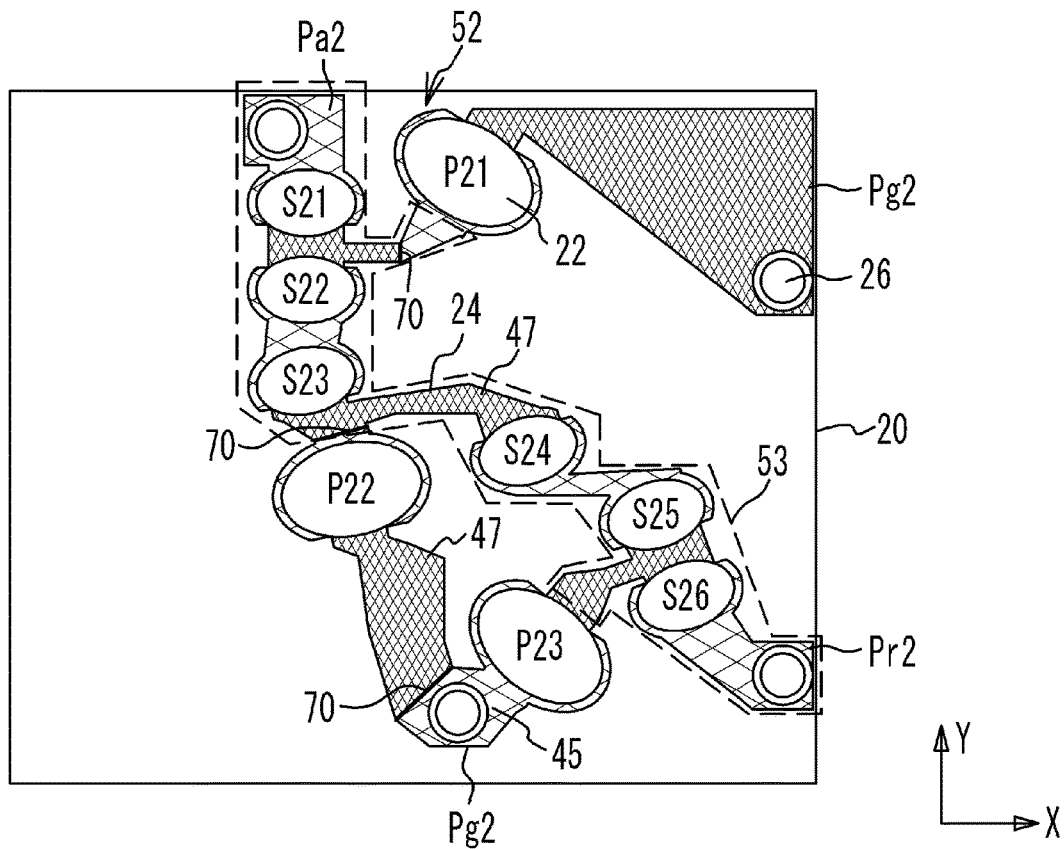
FIG. 13A is a plan view illustrating the bottom surface of the substrate 20 of a multiplexer in accordance with a first variation of the first embodiment.
Figure 13B:
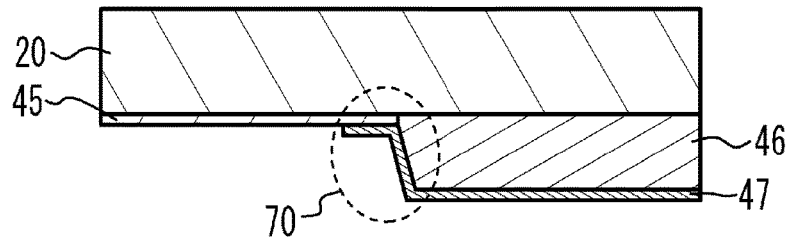
FIG. 13B is a cross-sectional view of a transferring part.

FIG. 13A is a plan view illustrating the bottom surface of the substrate 20 of a multiplexer in accordance with a first variation of the first embodiment, and FIG. 13B is a cross-sectional view of a connection part. As illustrated in FIG. 13A, in the first variation of the first embodiment, a connection part 70 for connecting the lower electrode 45 and the upper electrode 47 is disposed in the middle of the wiring line 24. The upper electrodes 47 of the series resonators S23 and S24 are connected to the wiring line L2, and the lower electrode 45 of the parallel resonator P22 is connected to the wiring line L2 (see FIG. 14B). In the wiring line L2, the upper electrode 47 and the lower electrode 45 are connected by the connection part 70. The upper electrode 47 of the parallel resonator P22 is connected to the wiring line L3 (see FIG. 14B).

As illustrated in FIG. 13B, in the connection part 70, the upper electrode 47 is formed on the side surface of the piezoelectric film 46, and in the connection part 70, the lower electrode 45 is electrically connected to the upper electrode 47.

Figure 14A:
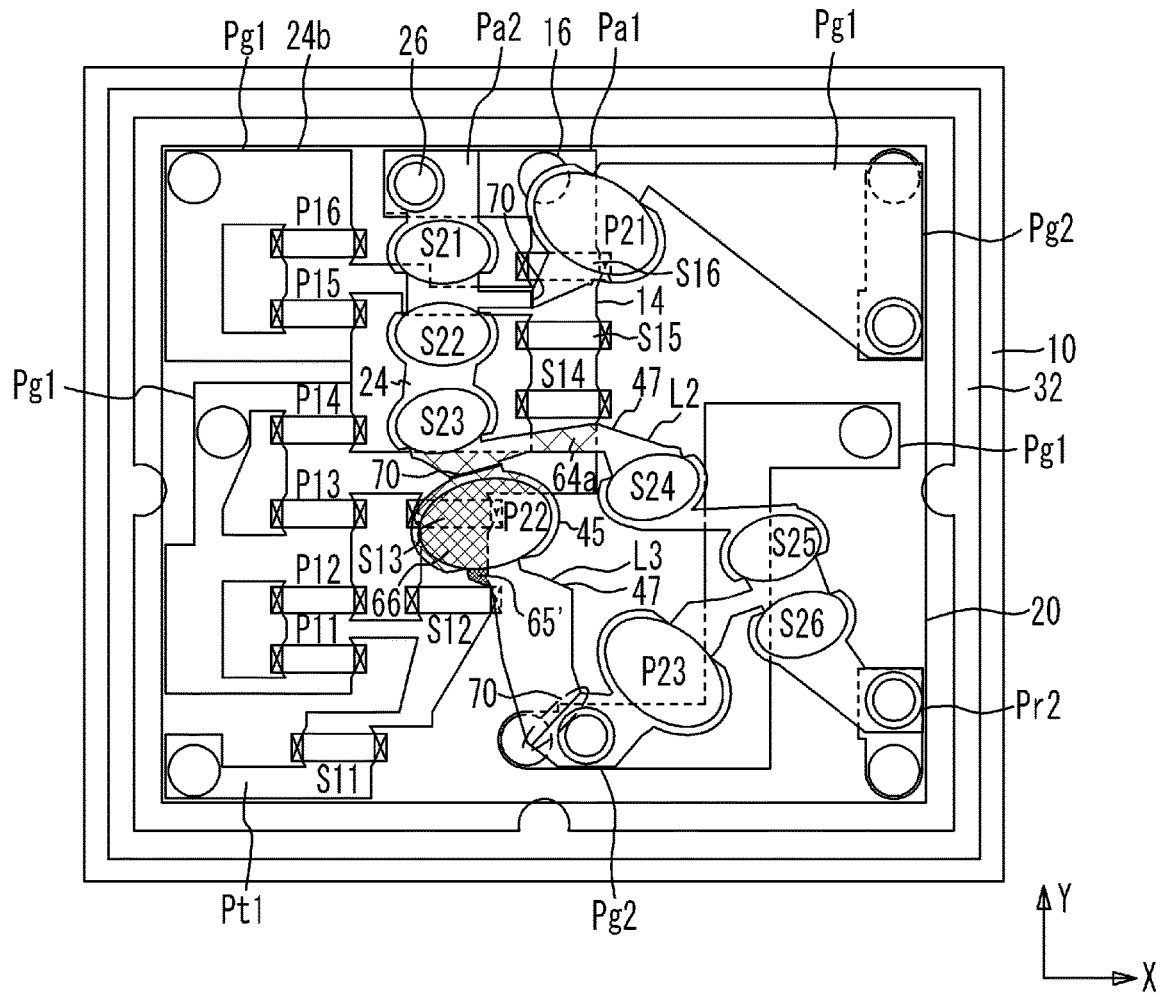
FIG. 14A is a plan view that superimposes the receive filter 52 in a multiplexer of the first variation of the first embodiment on the top surface of the substrate 10.
Figure 14B:
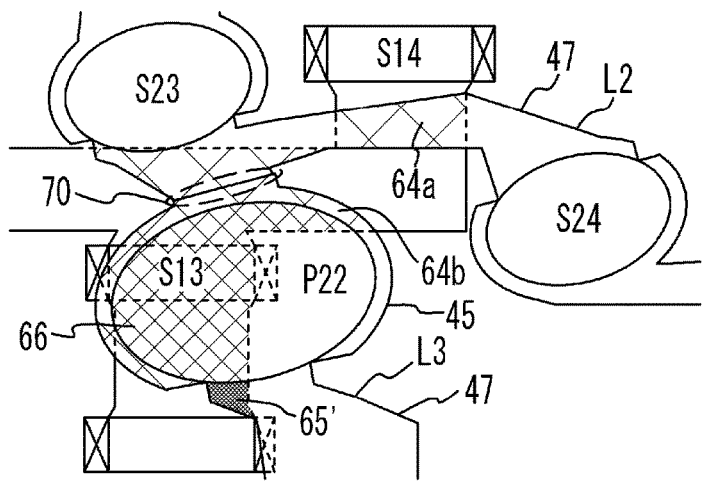
FIG. 14B is an enlarged view around the parallel resonator P22 of FIG. 14A.

FIG. 14A is a plan view that superimposes the receive filter 52 of the multiplexer of the first variation of the first embodiment on the top surface of the substrate 10, and FIG. 14B is an enlarged view around the parallel resonator P22 in FIG. 14A. As illustrated in FIG. 14A and FIG. 14B, the region 64 where the wiring line L2 overlaps with the series path 51 has a region 64a where the upper electrode 47 overlaps with the series path 51 and a region 64b where the lower electrode 45 overlaps with the series path 51. The region 64b is in contact with the parallel resonator P22. Other structures are the same as those of the multiplexer A of the first embodiment, and the description thereof is thus omitted.

In the first variation of the first embodiment, the wiring line L2 that connects the parallel resonator P22 to the series resonators S23 and S24 that are closest to the parallel resonator P22 in terms of electrical connection includes the connection part 70 (a connection wiring line) that electrically connects the lower electrode 45 extracted from the resonance region 48 in the parallel resonator P22 to the upper electrodes 47 extracted from the resonance regions 48 in the series resonators S23 and S24. This structure enables to connect the lower electrode 45 of the parallel resonator P22 to the wiring line L2. The connection part 70 is disposed between the parallel resonator P22 and the series resonator S23 and/or between the parallel resonator P22 and the series resonator S24. The connection part 70 may be disposed between the parallel resonator P22 and a ground.

Second Variation of the First Embodiment

Figure 15A:
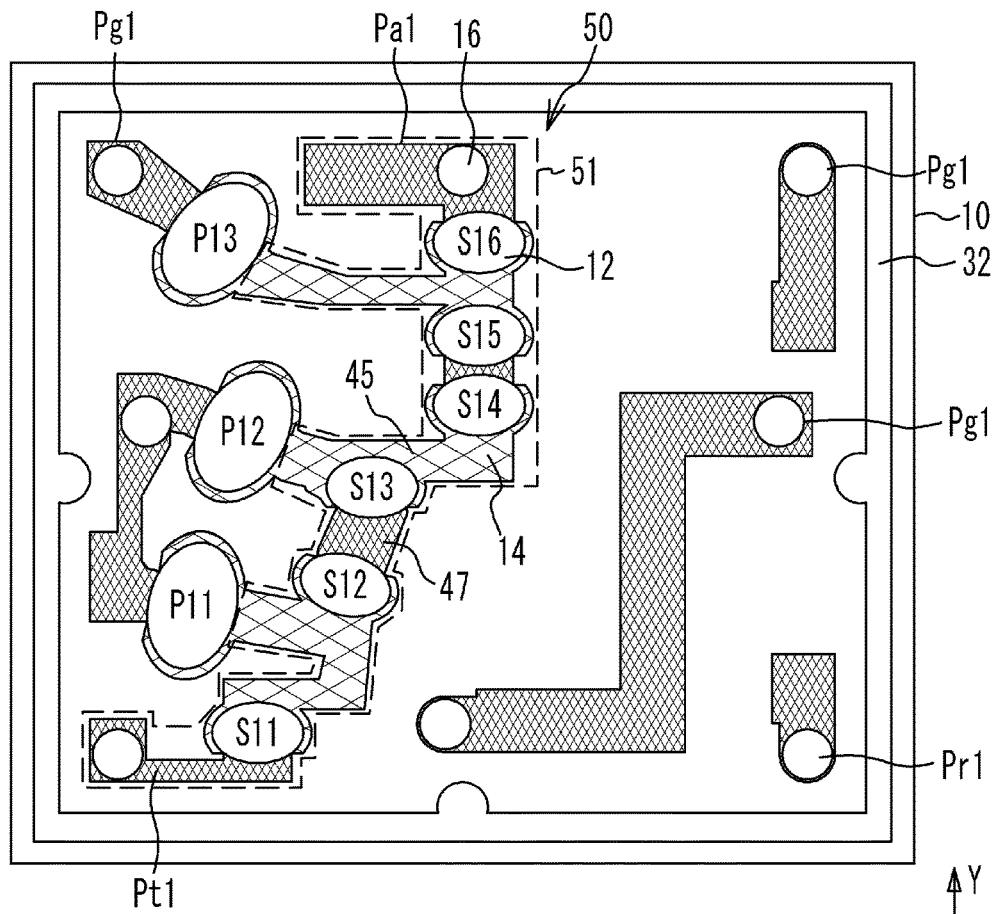
FIG. 15A is a plan view illustrating the top surface of the substrate 10 in accordance with a second variation of the first embodiment.
Figure 15B:
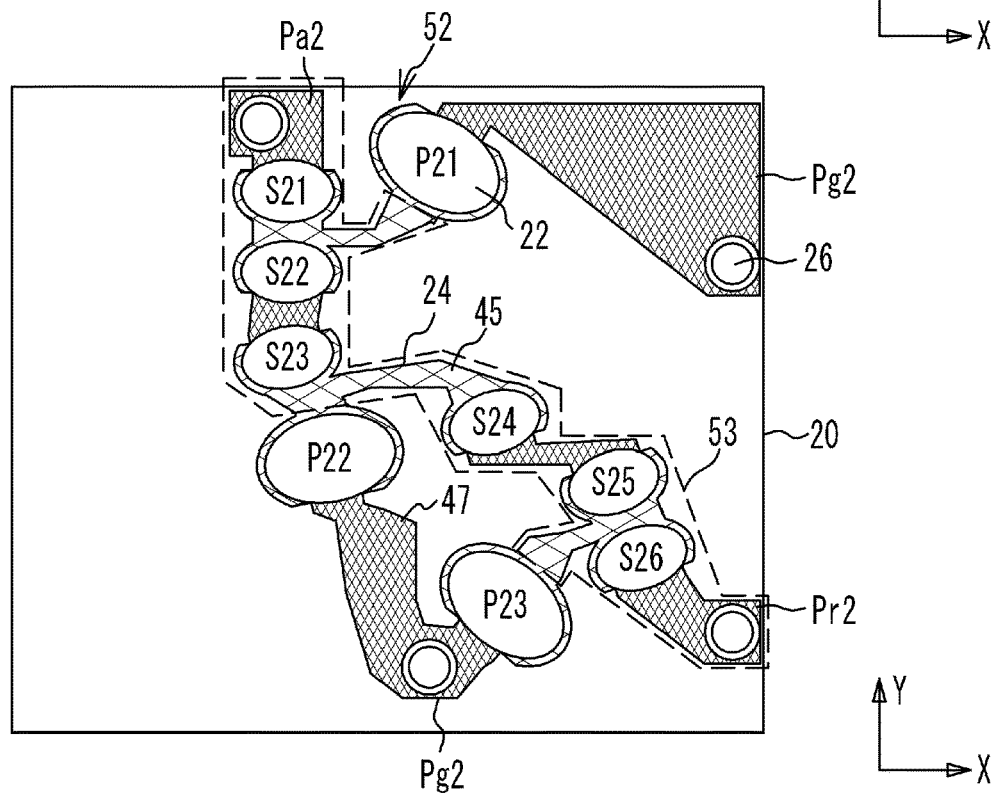
FIG. 15B is a plan view illustrating the bottom surface of the substrate 20.

FIG. 15A is a plan view illustrating the top surface of the substrate 10 in a second variation of the first embodiment, and FIG. 15B is a plan view illustrating the bottom surface of the substrate 20. As illustrated in FIG. 15A, the transmit filter 50 of the second variation of the first embodiment includes a piezoelectric thin film resonator as the acoustic wave resonator 12. The series resonators S11 to S16 are connected in series between the pads Pa1 and Pt2, and the parallel resonators P11 to P13 are connected in parallel between the pads Pa1 and Pt2. The wiring line 14 is formed of the lower electrode 45 or the upper electrode 47.

Figure 16A:
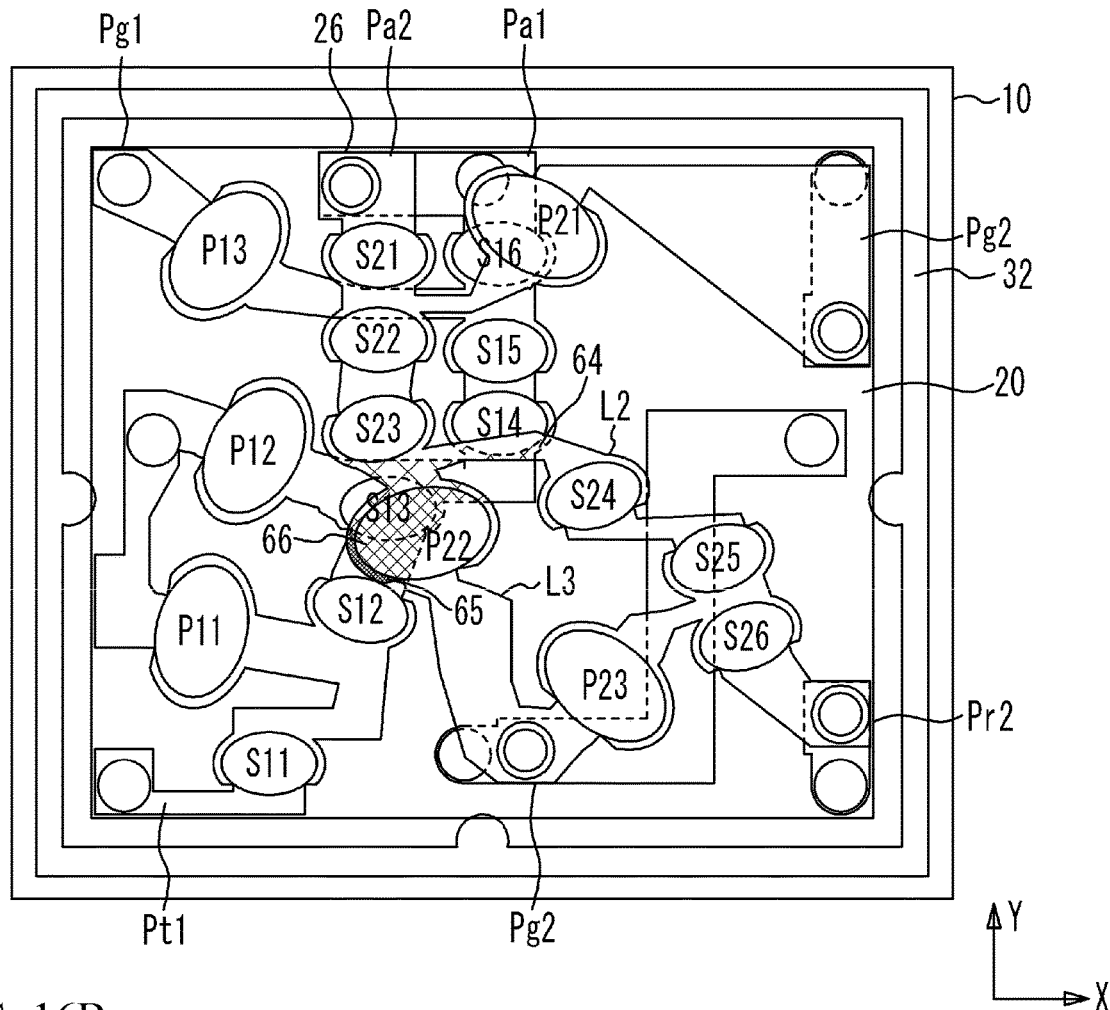
FIG. 16A is a plan view that superimposes the receive filter 52 in a multiplexer in accordance with the second variation of the first embodiment on the top surface of the substrate 10.
Figure 16B:
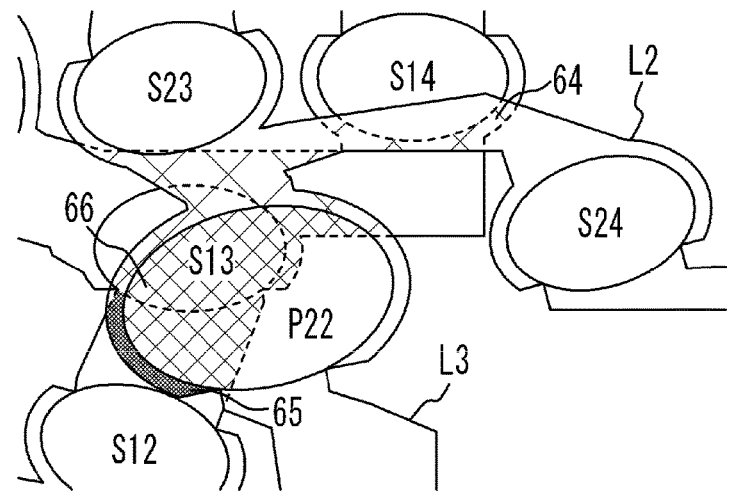
FIG. 16B is an enlarged view around the parallel resonator P22 in FIG. 16A.

FIG. 16A is a plan view that superimposes the receive filter 52 of the multiplexer of the second variation of the first embodiment on the top surface of the substrate 10, and FIG. 16B is an enlarged view around the parallel resonator P22 in FIG. 16A. As illustrated in FIG. 16A and FIG. 16B, in the region 64 where the wiring line L2 overlaps with the series path 51, the lower electrodes 45 overlap with each other, while in the region 65 where the wiring line L3 overlaps with the series path 51, the upper electrodes 47 overlap with each other. Other structures are the same as those of the multiplexer A of the first embodiment, and the description thereof is thus omitted.

As in the second variation of the first embodiment, the acoustic wave resonator 12 of the transmit filter 50 may be a piezoelectric thin film resonator. In the structure where the parallel resonator P22 overlaps with the series resonator S13, it is preferable that the lower electrode 45 extracted from the parallel resonator P22 overlaps with the lower electrode 45 extracted from the series resonator S13 and the upper electrode 47 extracted from the parallel resonator P22 overlaps with the upper electrode 47 extracted from the series resonator S13. This structure further reduces the capacitance C1 in FIG. 7A, and further increases the capacitance C2. Thus, the deterioration in isolation is further reduced.

Second Embodiment

Thought Experiment

Figure 17A:
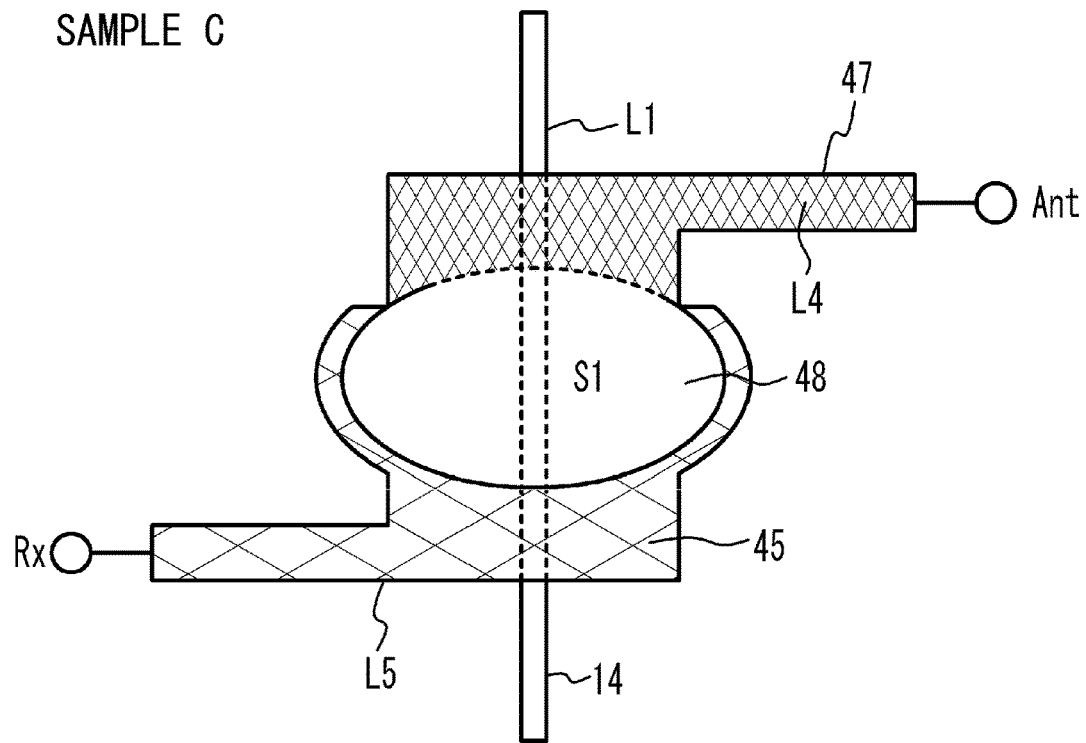
FIG. 17A and FIG. 17B are plan views of samples C and D in a thought experiment, respectively.
Figure 17B:
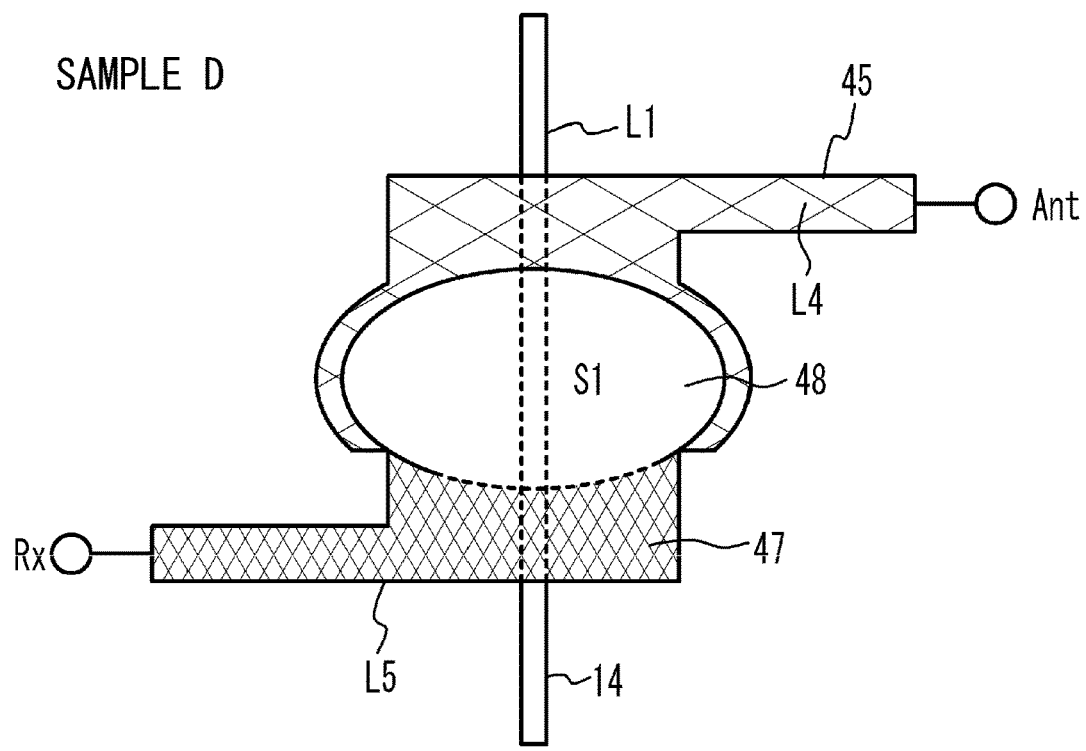
Figure 18A:
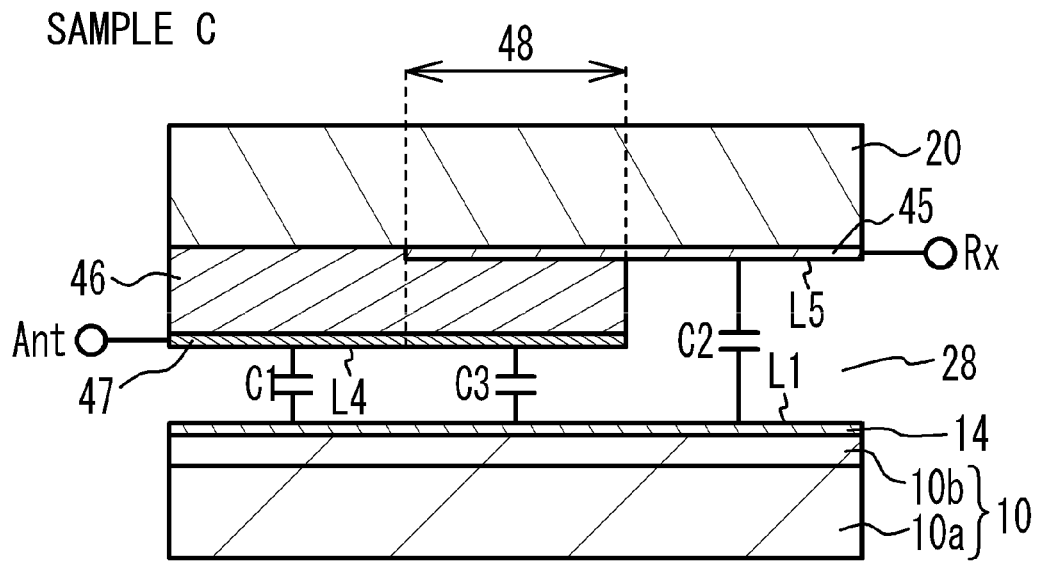
FIG. 18A and FIG. 18B are cross-sectional views of the samples C and D in the thought experiment, respectively.
Figure 18B:
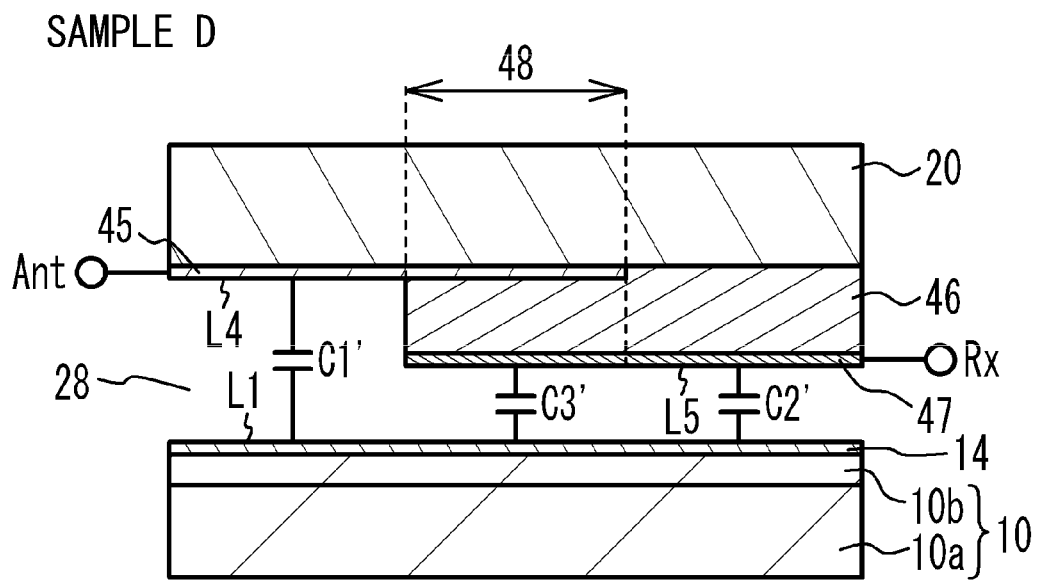

FIG. 17A and FIG. 17B are plan views of samples C and D in a thought experiment, respectively. FIG. 18A and FIG. 18B are cross-sectional views of the samples C and D in the thought experiment, respectively. FIG. 18A and FIG. 18B are cross-sectional views taken along the line L1 in FIG. 17A and FIG. 17B, respectively. The sample C corresponds to a second embodiment, and the sample D corresponds to a second comparative example.

As illustrated in FIG. 17A and FIG. 18A, in the sample C, the line L1 is formed of the wiring line 14 on the substrate 10. A first end of the series resonator S1 is connected to the common terminal Ant, and a second end of the series resonator S1 is connected to the receive terminal Rx. The wiring line L4 connecting between the series resonator S1 and the common terminal Ant is formed of the upper electrode 47. A wiring line L5 connecting between the series resonator S1 and the receive terminal Rx is formed of the lower electrode 45. The line L1 overlaps with the wiring lines L4 and L5 and the series resonator S1 in a plan view.

As illustrated in FIG. 17B and FIG. 18B, in the sample D, the wiring line L4 is formed of the lower electrode 45. The wiring line L5 is formed of the upper electrode 47. Other structures are the same as those of the sample C, and the description thereof is thus omitted.

Figure 19A:
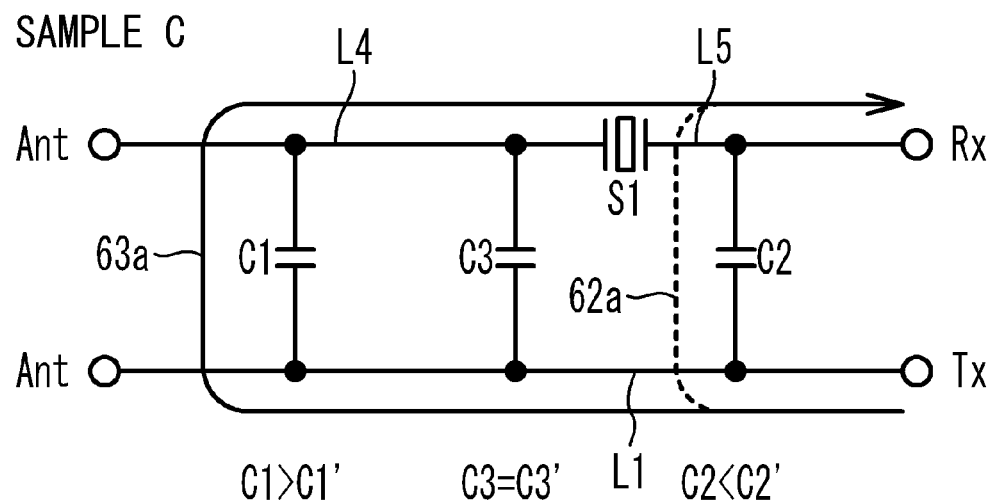
FIG. 19A and FIG. 19B illustrate equivalent circuits of the samples C and D, respectively.
Figure 19B:
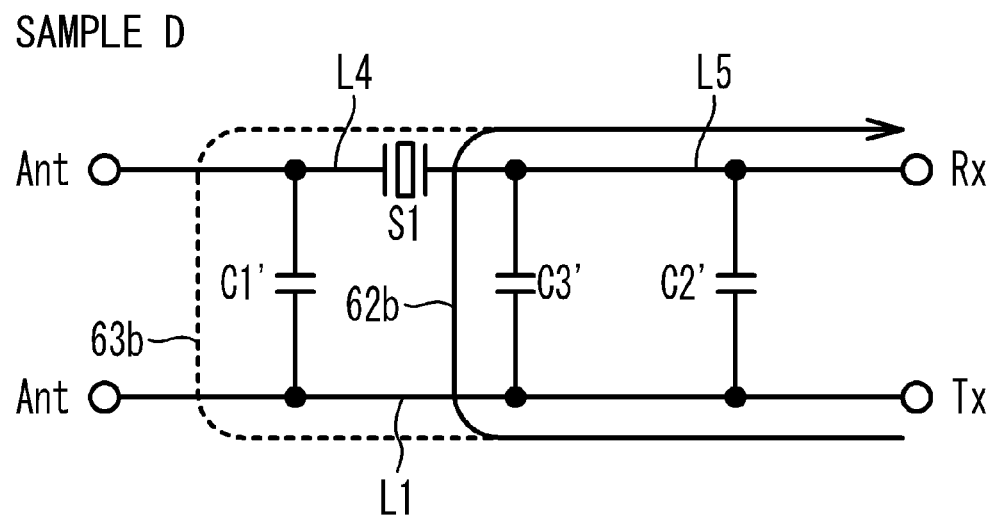

FIG. 19A and FIG. 19B illustrate equivalent circuits of the samples C and D, respectively. As illustrated in FIG. 19A, the line L1 is the series path 51 between the transmit terminal Tx and the common terminal Ant. The capacitance C1 corresponds to the parasitic capacitance between the line L1 and the wiring line L4 in FIG. 18A, the capacitance C2 corresponds to the parasitic capacitance between the line L1 and the wiring line L5 in FIG. 18A, and the capacitance C3 corresponds to the parasitic capacitance between the line L1 and the resonance region 48 in FIG. 18A. The parasitic capacitance between the line L1 and the resonance region 48 is mainly composed of the parasitic capacitance between the upper electrode 47 in the resonance region 48 and the line L1. In the sample C, since the upper electrode 47 in the resonance region 48 is connected to the wiring line L4, the capacitance C3 is located electrically closer to the common terminal Ant than the series resonator S1.

The capacitance C1' in FIG. 19B corresponds to the parasitic capacitance between the line L1 and the wiring line L4 in FIG. 18B, the capacitance C2' in FIG. 19B corresponds to the parasitic capacitance between the line L1 and the wiring line L5 in FIG. 18B, and the capacitance C3' corresponds to the parasitic capacitance between the line L1 and the lower electrode 45 in the resonance region 48 in FIG. 18B. In the sample D, since the upper electrode 47 is connected to the receive terminal Rx, the capacitance C3' is located electrically closer to the receive terminal Rx than the series resonator S1.

Furthermore, the distance between the line L1 and the wiring line L4 in the sample C is less than that in the sample D as illustrated in FIG. 18A and FIG. 18B. Thus, C1>C1'. The distance between the line L1 and the wiring line L5 in the sample C is greater than that in the sample D. Thus, C2<C2'. The distance between the line L1 and the upper electrode 47 in the resonance region 48 is the same between the samples C and D as illustrated in FIG. 18A and FIG. 18B. Thus, C3=C3'.

In the sample C, the signal 63a leaking from the transmit terminal Tx to the wiring line L4 and the resonance region 48 leaks from the line L1 to the wiring line L4 and the resonance region 48 through the capacitance C1+C3. In the sample D, the signal 63b leaking from the transmit terminal Tx to the wiring line L5 leaks from the line L1 to the wiring line L5 through the capacitance C1'. Since C1+C3>C1', the signal 63a becomes larger than the signal 63b.

In the sample C, the signal 62a leaking from the transmit terminal Tx to the wiring line L5 leaks from the line L1 to the wiring line L5 through the capacitance C2. In the sample D, the signal 62b leaking from the transmit terminal Tx to the wiring line L5 and the upper electrode 47 in the resonance region 48 leaks from the line L1 to the wiring line L5 and the upper electrode 47 in the resonance region 48 through the capacitance C1'+C3'. Since C2<C2'+C3', the signal 62a becomes smaller than the signal 62b.

In the sample C, the signal leaking from the transmit terminal Tx to the receive terminal Rx is mainly composed of the signal 63a, and the signal 63a passes through the series resonator S1. On the other hand, in the sample D, the signal leaking from the transmit terminal Tx to the receive terminal Rx is mainly composed of the signal 62b, and the signal 62b does not pass through the series resonator S1. In the sample C, the signal 63a is suppressed in the series resonator S1. This is considered the reason why the isolation characteristic of the sample C is improved compared with that of the sample D.

Figure 20A:
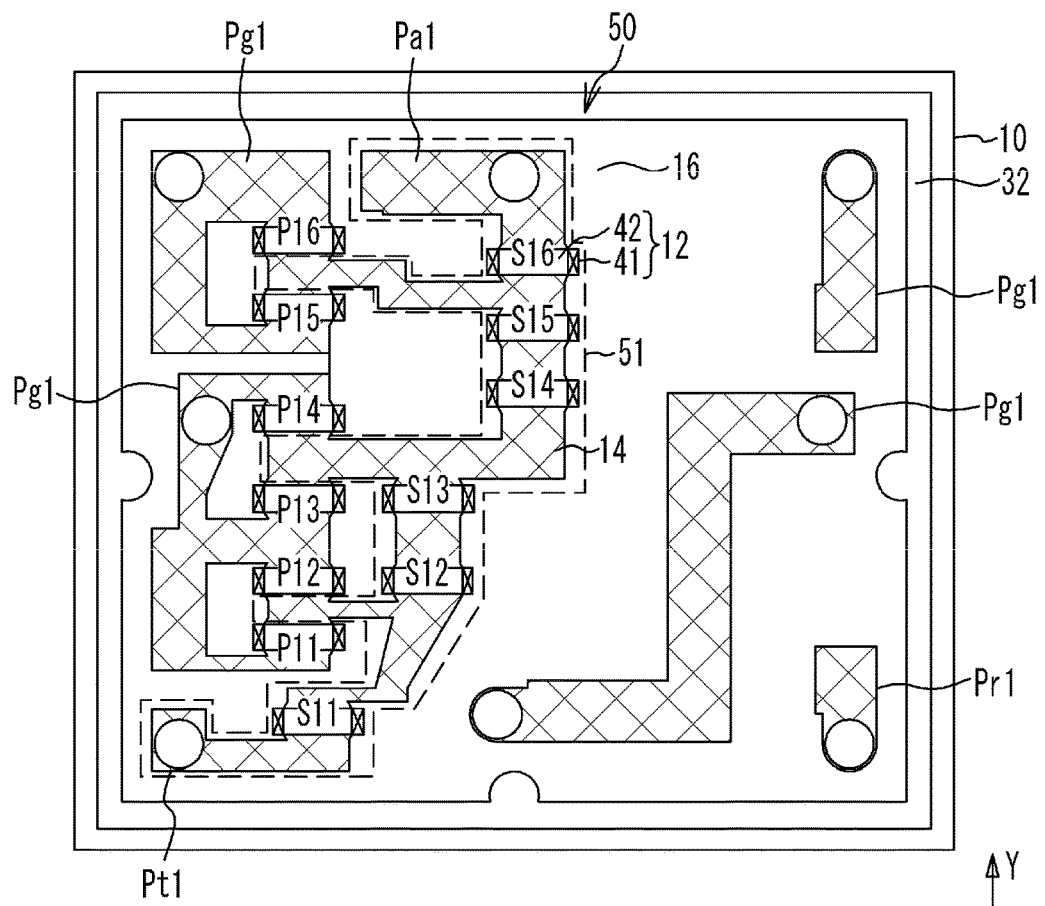
FIG. 20A is a plan view illustrating the top surface of the substrate 10 in the second embodiment.
Figure 20B:
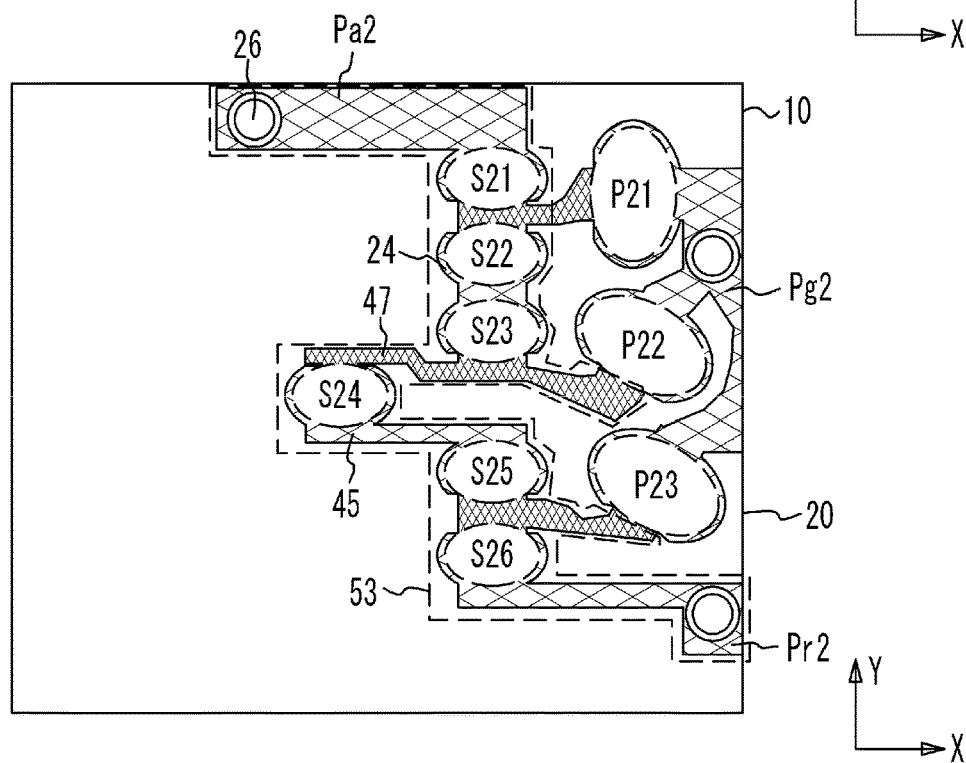
FIG. 20B is a plan view illustrating the bottom surface of the substrate 20.
Figure 21A:
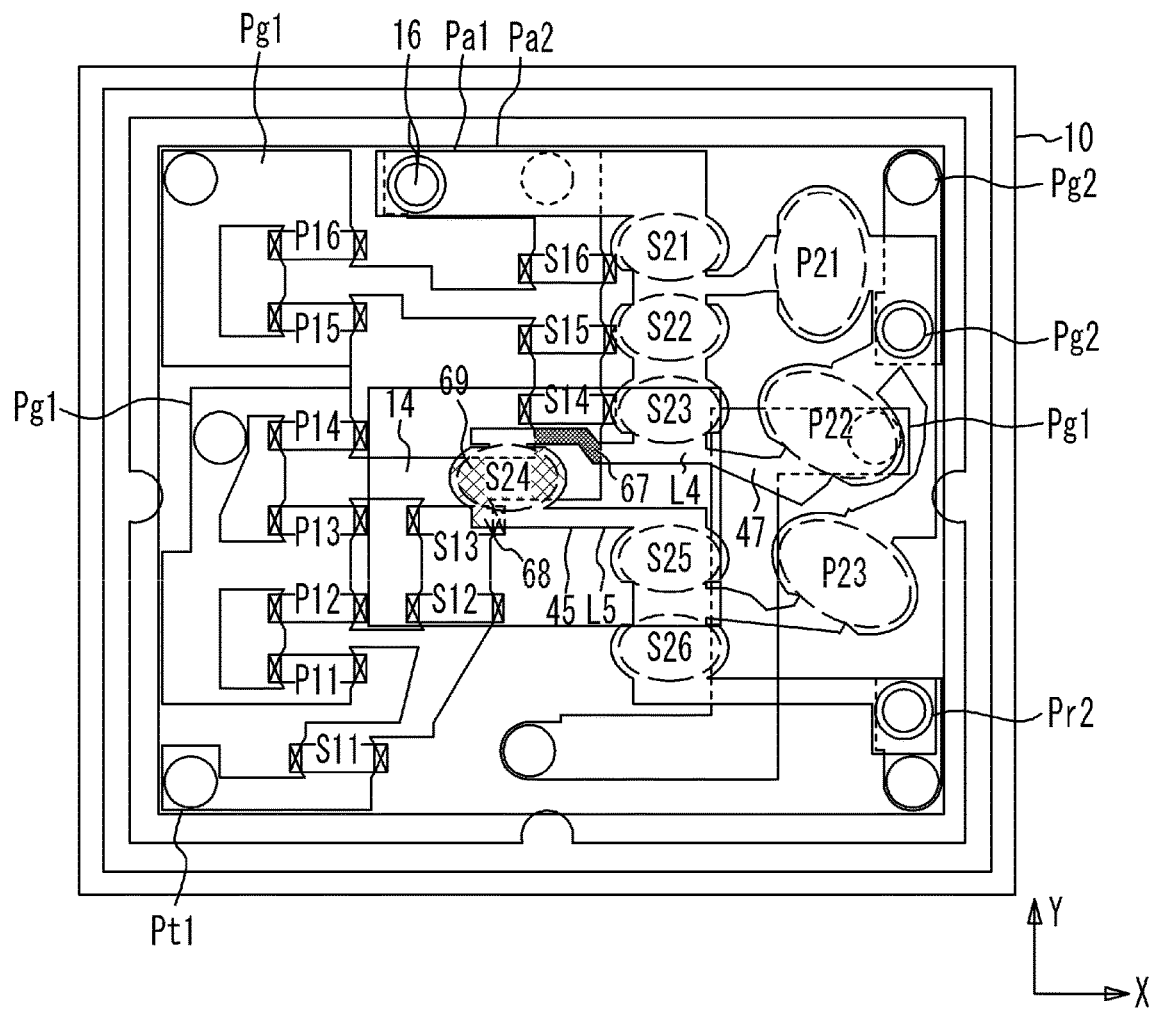
FIG. 21A is a plan view that superimposes the receive filter 52 in the multiplexer of the second embodiment on the top surface of the substrate 10.
Figure 21B:
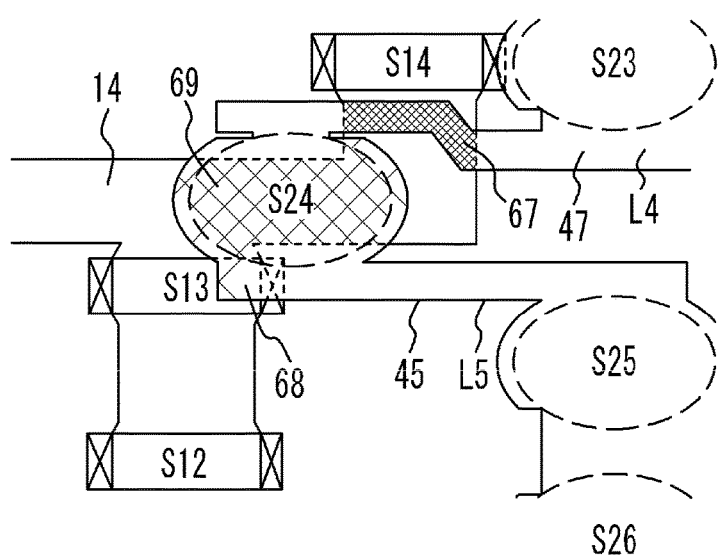
FIG. 21B is an enlarged view around a series resonator S24 in FIG. 21A.

FIG. 20A is a plan view illustrating the top surface of the substrate 10 in the second embodiment, and FIG. 20B is a plan view illustrating the bottom surface of the substrate 20. FIG. 21A is a plan view that superimposes the receive filter 52 of the multiplexer of the second embodiment on the top surface of the substrate 10, and FIG. 21B is an enlarged view around the series resonator S24 in FIG. 21A. As illustrated in FIG. 20A to FIG. 21B, the transmit filter 50 of the second embodiment is the same as that of the multiplexer A of the first embodiment. A part of the series resonator S24 overlaps with a part of the series path 51.

The wiring line connecting between the series resonators S23 and S24 corresponds to the wiring line L4, and the wiring line connecting between the series resonators S24 and S25 corresponds to the wiring line L5 (see FIG. 21B). The region where the wiring line L4 overlaps with the series path 51 is indicated as a region 67 by cross-hatching, the region where the wiring line L5 overlaps with the series path 51 is indicated as a region 68 by cross-hatching, and the region where the resonance region of the series resonator S24 overlaps with the series path 51 is indicated as a region 69 by cross-hatching. The wiring line L4 is formed of the upper electrode 47, and the wiring line L5 is formed of the lower electrode 45. In the region 67, the upper electrode 47 overlaps with the wiring line 14, and in the region 68, the lower electrode 45 overlaps with the wiring line 14. The upper electrode 47 of the series resonator S24 is connected to the wiring line L4.

In the second embodiment, in at least one series resonator S24 of one or more series resonators S21 to S26, the lower electrode 45 is connected to the receive terminal Rx, and the upper electrode 47 is connected to the common terminal Ant. At least a part of the resonance region 48 overlaps with at least a part of the series path 51 in a plan view. This structure allows the signal leaking from the series path 51 to the series path 53 through the series resonator S24 to be suppressed by the series resonator S24, reducing the deterioration in isolation.

In addition, in the series resonator S24, at least a part of the lower electrode 45 extracted from the resonance region 48 and at least a part of the upper electrode 47 extracted from the resonance region 48 overlap with at least a part of the series path 51 in a plan view. This structure allows the signal leaking from the series path 51 to the series path 53 through the series resonator S24 and the wiring lines L2 and L3 to be suppressed by the series resonator S24, thereby, reducing the deterioration in isolation.

The signal leaking from the transmit filter 50 to the receive filter 52 through the series resonator S21, which is electrically closest to the common terminal Ant among the series resonators S21 to S26, is suppressed by the parallel resonators P21 to P23 and the series resonators S22 to S26 that are electrically closer to the receive terminal Rx than the series resonator S21. Thus, even when the upper electrode 47 of the series resonator S21 is connected to a ground and the signal is suppressed by the series resonator S21, the effect is not so large. Thus, it is preferable that the series resonator overlapping with the series path 51 is a series resonator other than the series resonator S21 closest to the common terminal Ant in terms of electrical connection among the series resonators S21 to S26.

When the parallel resonator P23 and the series resonators S25 and S26 that are electrically closer to the receive terminal Rx than the series resonator S24 overlap with the series path 51, the signal leaking from the transmit terminal Tx to the receive terminal Rx becomes large. Thus, it is preferable that the parallel resonator P23 and the series resonators S25 and S26 do not overlap with the series path 51 in a plan view. This structure further reduces the deterioration in isolation.

First Variation of the Second Embodiment

Figure 22A:
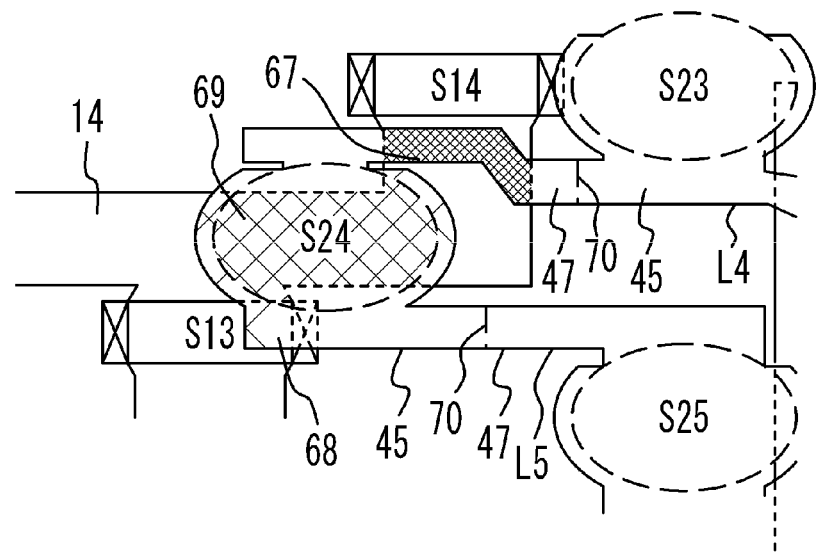
FIG. 22A illustrates the vicinity of the series resonator S24 in a plan view that superimposes the receive filter 52 in the multiplexer in accordance with the first variation of the second embodiment on the top surface of the substrate 10.

FIG. 22A illustrates the vicinity of the series resonator S24 in a plan view that superimposes the receive filter 52 in the multiplexer of a first variation of the second embodiment on the top surface of the substrate 10. As illustrated in FIG. 22A, each of the wiring lines L4 and L5 includes the connection part 70. The wiring line L4 is connected to the lower electrode 45 of the series resonator S23, and the wiring line L4 is connected to the upper electrode 47 of the series resonator S24 by the connection part 70. The wiring line L5 is connected to the upper electrode 47 of the series resonator S25, and the wiring line L5 is connected to the lower electrode 45 of the series resonator S24 by the connection part 70. Other structures are the same as those of the second embodiment, and the description thereof is thus omitted.

In the first variation of the second embodiment, each of the wiring line L4 connecting the series resonator S24 to the series resonator S23 that are closest to the series resonator S24 in terms of electrical connection and the wiring line L5 connecting the series resonator S24 to the series resonator S25 closest to the series resonator S24 in terms of electrical connection include the connection part 70 (a connection wiring line) that electrically connects one of the lower electrode 45 and the upper electrode 47 extracted from the resonance region 48 in the series resonator S24 to the other of the lower electrode 45 and the upper electrode 47 extracted from the resonance region 48 in the series resonators S23 and S25. This structure allows the lower electrode 45 and the upper electrode 47 of the series resonator S24 to be connected to the wiring lines L5 and L4, respectively. The connection part 70 is disposed between the series resonator S24 and the series resonator S23 and/or between the series resonator S24 and the series resonator S25.

Second Variation of the Second Embodiment

Figure 22B:
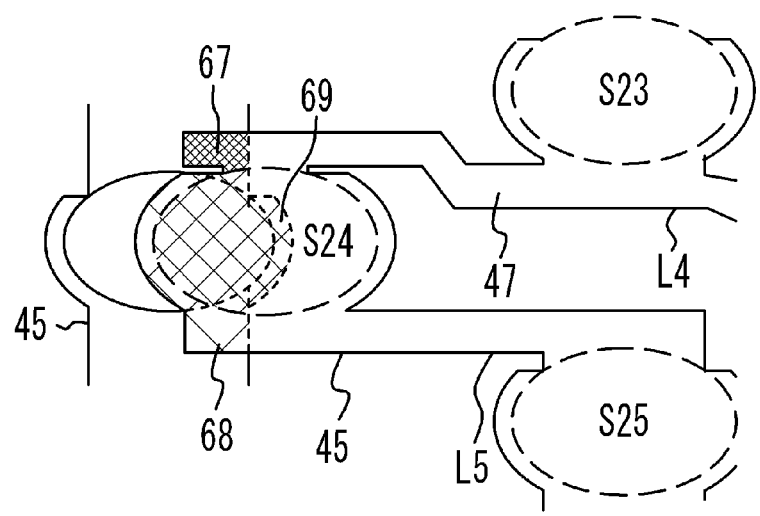
FIG. 22B illustrates the vicinity of the series resonator S24 in a plan view that superimposes the receive filter 52 in the multiplexer in accordance with the second variation of the second embodiment on the top surface of the substrate 10.

FIG. 22B illustrates the vicinity of the series resonator S24 in a plan view that superimposes the receive filter 52 of the multiplexer of a second variation of the second embodiment on the top surface of the substrate 10. As illustrated in FIG. 22B, the acoustic wave resonator 12 is a piezoelectric thin film resonator. In the region 67 where the wiring line L4 overlaps with the series path 51, the upper electrodes 47 overlap with each other, while in the region 68 where the wiring line L5 overlaps with the series path 51, the lower electrodes 45 overlap with each other. Other structures are the same as those of the second embodiment, and the description thereof is thus omitted.

In the second variation of the second embodiment, in the series resonator S24, at least a part of the resonance region 48 overlaps with at least a part of at least one series resonator S13 of one or more series resonators S11 to S16 in a plan view. This structure further improves the isolation.

The acoustic wave resonator 12 of the transmit filter 50 may be a piezoelectric thin film resonator. In the structure where the series resonator S24 overlaps with the series resonator S13, it is preferable that the lower electrode 45 extracted from the series resonator S24 overlaps with the lower electrode 45 extracted from the series resonator S13 and the upper electrode 47 extracted from the series resonator S24 overlaps with the upper electrode 47 extracted from the series resonator S13. This structure further increases the capacitance C1 in FIG. 19A, and further reduces the capacitance C2. Thus, the deterioration in isolation is further reduced.

In the first and second embodiments and the variations thereof, when the acoustic wave resonator 12 is a surface acoustic wave resonator, the IDT 42 of the series resonator is included in the series path 51 and the reflectors 41 of the series resonator are not included in the series path 51. When the acoustic wave resonator 12 is a piezoelectric thin film resonator, the resonance region is included in the series path 51.

In the first and second embodiments and the variations thereof, the first filter is the receive filter 52 and the second filter is the transmit filter 50. However, the first filter may be the transmit filter 50 and the second filter may be the receive filter 52. The number of the series resonators structuring the ladder-type filter and the number of the parallel resonators structuring the ladder-type filter may be freely selected. The structure where the sealing portion 30 is formed so as to surround the substrate 20 has been described, but the sealing portion 30 may be omitted. A duplexer has been described as an example of the multiplexer, but the multiplexer may be a triplexer or a quadplexer. The first filter and the second filter are at least two filters of the multiplexer.

Although the embodiments of the present invention have been described in detail, the present invention is not limited to such a specific embodiment, and it is to be understood that the various change, substitutions, and alterations could be made hereto without departing from the spirit and scope of the invention.

What is claimed is:

1. A multiplexer comprising:
   a first substrate having a first surface;
   a second substrate having a second surface that overlaps with the first surface with an air gap interposed between the first surface and the second surface in a plan view;
   a first filter disposed on the first surface, the first filter including one or more first series resonators connected in series with a first series path from a common terminal to a first terminal, and one or more first parallel resonators each having a first end coupled to the first series path and a second end coupled to a ground; and
   a second filter disposed on the second surface, the second filter including one or more second series resonators connected in series with a second series path from the common terminal to a second terminal, and one or more second parallel resonators each having a first end coupled to the second series path and a second end coupled to a ground,
   each of the one or more second series resonators and the one or more second parallel resonators including a piezoelectric film, a first electrode that is interposed between the piezoelectric film and the second substrate, and a second electrode that is interposed between the piezoelectric film and the air gap and forms a resonance region where the second electrode overlaps with the first electrode with at least a part of the piezoelectric film interposed between the first electrode and the second electrode in a plan view,
   in at least one second parallel resonator of the one or more second parallel resonators, the first electrode being coupled to the second series path, the second electrode being coupled to the ground, at least a part of the resonance region overlapping with at least a part of the first series path in a plan view, wherein
  a third resonator of the one or more second series resonators and a fourth resonator of the one or more second parallel resonators are closer to the second terminal, in terms of electrical connection, than a second parallel resonator that is closest to the second terminal among the at least one second parallel resonator, and
  neither the third or fourth resonators overlap with the first series path in a plan view.

2. The multiplexer according to claim 1, wherein at least a part of a first electrode extracted from the resonance region in the at least one second parallel resonator and at least a part of a second electrode extracted from the resonance region in the at least one second parallel resonator overlap with at least a part of the first series path in a plan view.

3. The multiplexer according to claim 1, wherein in the at least one second parallel resonator, at least a part of the resonance region overlaps with at least a part of at least one first series resonator of the one or more first series resonators in a plan view.

4. The multiplexer according to claim 1, wherein
  the one or more second parallel resonators are a plurality of second parallel resonators, and
  the at least one second parallel resonator includes a second parallel resonator other than a second parallel resonator that is closest to the common terminal in terms of electrical connection among the plurality of second parallel resonators.

5. The multiplexer according to claim 1, wherein a wiring line connecting the at least one second parallel resonator to a second series resonator that is closest to the at least one second parallel resonator in terms of electrical connection includes a connection wiring line that electrically connects a first electrode extracted from the resonance region in the at least one second parallel resonator to a second electrode extracted from the resonance region in a second series resonator that is closest to the at least one second parallel resonator in terms of electrical connection.

6. The multiplexer according to claim 1, wherein the one or more second series resonators and the one or more second parallel resonators include a resonator that does not overlap with the first series path in a plan view.

7. The multiplexer according to claim 1, wherein a passband of the first filter does not overlap with a passband of the second filter.

8. A multiplexer comprising:
  a first substrate having a first surface;
  a second substrate having a second surface that overlaps with the first surface with an air gap interposed between the first surface and the second surface in a plan view;
  a first filter disposed on the first surface, the first filter including one or more first series resonators connected in series with a first series path from a common terminal to a first terminal, and one or more first parallel resonators each having a first end coupled to the first series path and a second end coupled to a ground; and
  a second filter disposed on the second surface, the second filter including one or more second series resonators connected in series with a second series path from the common terminal to a second terminal, and one or more second parallel resonators each having a first end coupled to the second series path and a second end coupled to a ground,
  each of the one or more second series resonators and the one or more second parallel resonators including a piezoelectric film, a first electrode interposed between the piezoelectric film and the second substrate, and a second electrode that is interposed between the piezoelectric film and the air gap and forms a resonance region where the second electrode overlaps with the first electrode with at least a part of the piezoelectric film interposed between the first electrode and the second electrode in a plan view,
  in at least one second series resonator of the one or more second series resonators, the first electrode being coupled to the second terminal, the second electrode being coupled to the common terminal, at least a part of the resonance region overlapping with at least a part of the first series path in a plan view,
  wherein
  a third resonator of the one or more second series resonators and a fourth resonator of the one or more second parallel resonators are closer to the second terminal, in terms of electrical connection, than a second series resonator that is closest to the second terminal among the at least one second series resonator, and
  neither the third or fourth resonators overlap with the first series path in a plan view.

9. The multiplexer according to claim 8, wherein at least a part of a first electrode extracted from the resonance region in the at least one second series resonator and at least a part of a second electrode extracted from the resonance region in the at least one second series resonator overlap with at least a part of the first series path in a plan view.

10. The multiplexer according to claim 8, wherein in the at least one second series resonator, at least a part of the resonance region overlaps with at least a part of at least one first series resonator of the one or more first series resonators in a plan view.

11. The multiplexer according to claim 8, wherein
  the one or more second series resonators are a plurality of second series resonators, and
  the at least one second series resonator is a second series resonator other than a second series resonator that is closest to the common terminal in terms of electrical connection among the plurality of second series resonators.

12. The multiplexer according to claim 8, wherein
  the one or more second series resonators are a plurality of second series resonators,
  a wiring line connecting the at least one second series resonator to a second series resonator that is closest to the at least one second series resonator in terms of electrical connection includes a connection wiring line that electrically connects one of a first electrode and a second electrode that are extracted from the resonance region in the at least one second series resonator to the other of a first electrode and a second electrode that are extracted from the resonance region in a second series resonator that is closest to the at least one second series resonator in terms of electrical connection.

* * * * *